United States Patent
Abe et al.

(10) Patent No.: US 10,643,872 B2
(45) Date of Patent: May 5, 2020

(54) LIQUID PROCESSING APPARATUS, LIQUID PROCESSING METHOD, AND STORAGE MEDIUM

(71) Applicant: Tokyo Electron Limited, Tokyo (JP)

(72) Inventors: Masahiro Abe, Kumamoto (JP); Hiroichi Inada, Kumamoto (JP); Tohru Azuma, Kumamoto (JP); Tsunenaga Nakashima, Kumamoto (JP); Naofumi Kishita, Kumamoto (JP); Hideki Kajiwara, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 15/619,920

(22) Filed: Jun. 12, 2017

(65) Prior Publication Data

US 2017/0358464 A1 Dec. 14, 2017

(30) Foreign Application Priority Data

Jun. 13, 2016 (JP) .................................. 2016-117221

(51) Int. Cl.
*H01L 21/67* (2006.01)
*G03F 7/16* (2006.01)

(52) U.S. Cl.
CPC .......... *H01L 21/6715* (2013.01); *G03F 7/162* (2013.01)

(58) Field of Classification Search
None
See application file for complete search history.

(56) References Cited

U.S. PATENT DOCUMENTS

2002/0035762 A1* 3/2002 Okuda .................... B08B 1/04
15/77
2008/0121252 A1* 5/2008 Miya ...................... B08B 3/10
134/4
2014/0370199 A1* 12/2014 Kishita ............... H01L 21/6715
427/424

FOREIGN PATENT DOCUMENTS

| JP | 2014-241382 A | 12/2014 |
| TW | 201244830 A | 11/2012 |
| TW | 201511845 A | 4/2015 |

* cited by examiner

*Primary Examiner* — Christi J Tate-Sims
(74) *Attorney, Agent, or Firm* — Abelman, Frayne & Schwab

(57) ABSTRACT

Disclosed is a liquid processing apparatus including: a plurality of substrate placement regions; a nozzle that supplies a processing liquid to a substrate from each processing position; a nozzle placement region provided behind a row of the substrate placement regions; an arm that detachably holds the nozzle at one end side; a driving unit that horizontally pivots the arm around a pivot axis; and a controller that outputs a control signal to convey the nozzle from the nozzle placement region to a standby position corresponding to a processing position of a conveyance destination, cause the nozzle to stand by at the standby position, and then, convey the nozzle to the processing position. The standby position is outside the substrate placement regions and is located between the processing position and the nozzle placement region when viewed in a front-and-rear direction.

10 Claims, 22 Drawing Sheets

LIQUID PROCESSING APPARATUS, LIQUID PROCESSING METHOD, AND STORAGE MEDIUM

CROSS-REFERENCE TO RELATED APPLICATIONS

This application is based on and claims priority from Japanese Patent Application No. 2016-117221 filed on Jun. 13, 2016 with the Japan Patent Office, the disclosure of which is incorporated herein in its entirety by reference.

TECHNICAL FIELD

The present disclosure relates to a liquid processing apparatus and a liquid processing method for performing a liquid processing on a substrate by supplying a processing liquid thereto, and a storage medium including a computer program used in the liquid processing apparatus.

BACKGROUND

In a photolithography process of a semiconductor manufacturing process, a liquid processing apparatus performs a processing by supplying a processing liquid (e.g., a resist) to a surface of a semiconductor wafer (hereinafter, referred to as a "wafer") as a substrate. In order to increase the throughput, the liquid processing apparatus may include a plurality of cups having a substrate holding unit therein so that wafers are processed in parallel in the cups. Further, in order to reduce the manufacturing cost of the apparatus, the apparatus may be configured such that a nozzle is shared between the plurality of cups, and the nozzle is moved between the plurality of cups by an arm.

Further, in the liquid processing apparatus in which a nozzle is shared by a plurality of cups as described above, a plurality of nozzles may be provided to supply different kinds of processing liquids in order to deal with diversification of processings. In this case, for example, each nozzle is placed on a placing portion outside the cup, and the arm selectively holds one of the nozzles and conveys the nozzle onto a wafer of each cup, thereby performing a processing. Japanese Patent Laid-Open Publication No. 2014-241382 discloses a liquid processing apparatus configured in that manner.

SUMMARY

In an aspect of the present disclosure, there is provided a liquid processing apparatus including: a plurality of substrate placement regions arranged in a left-and-right direction; a nozzle that supplies a processing liquid to a substrate from each processing position on each of the substrate placement regions to process the substrate; a nozzle placement region which is provided behind a row of the substrate placement regions and on which the nozzle is placed; an arm that detachably holds the nozzle at one end side; a driving unit that horizontally pivots the arm around a pivot axis positioned at a rear side of the substrate placement regions and moves the pivot axis in the left-and-right direction; and a controller that outputs a control signal to convey the nozzle from the nozzle placement region to a standby position corresponding to a processing position of a conveyance destination among standby positions set corresponding to the processing positions, from a rear side, cause the nozzle to stand by at the standby position, and then, convey the nozzle to the processing position. The standby position is outside the substrate placement regions and is located between the processing position and the nozzle placement region when viewed in a front-and-rear direction.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
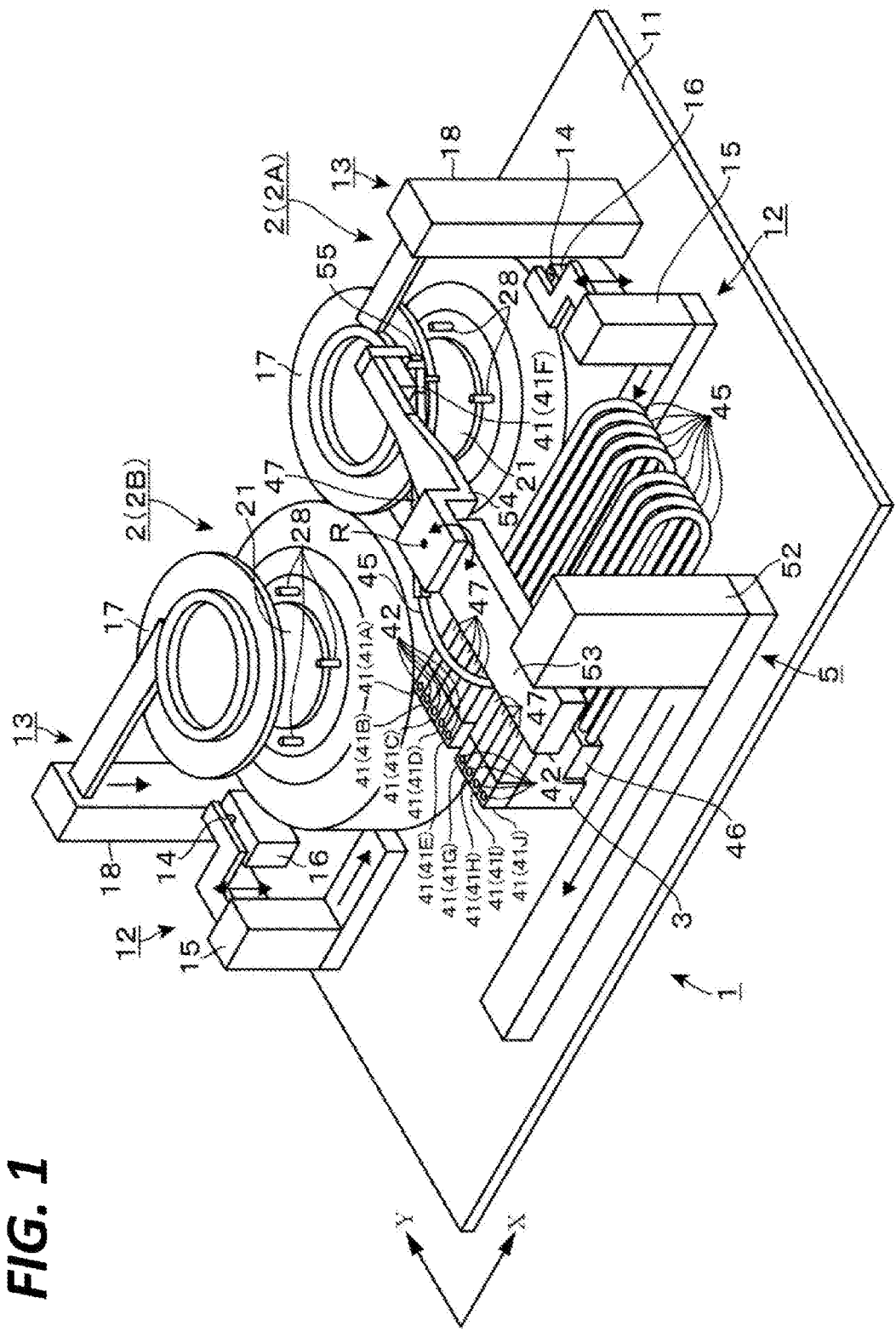
FIG. 1 is a perspective view of a resist coating apparatus according to a liquid processing apparatus of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Each of the nozzles is connected with a pipe that supplies a processing liquid to the nozzle. As described above, when the nozzles are conveyed between the cups and placing portions by the arm, the conveyance path of the nozzles becomes relatively complicated. Further, the arm is moved at a relatively high speed to ensure high throughput. Therefore, the pipe connected to the nozzles during the conveyance may be damaged due to sudden large bending or twisting. Japanese Patent Laid-Open Publication No. 2014-241382 does not describe a sufficient solution of such a problem.

The present disclosure has been made in consideration of such circumstances and is to provide a liquid processing method and a liquid processing method in which a nozzle is conveyed between a nozzle placement region and respective processing positions on a plurality of substrate placement regions. In addition, the present disclosure is to suppress any damage to a pipe connected to the nozzle and to suppress decrease in throughput.

In an aspect of the present disclosure, there is provided a liquid processing apparatus including: a plurality of substrate placement regions arranged in a left-and-right direction; a nozzle that supplies a processing liquid to a substrate from each processing position on each of the substrate placement regions to process the substrate; a nozzle placement region which is provided behind a row of the substrate placement regions and on which the nozzle is placed; an arm that detachably holds the nozzle at one end side; a driving unit that horizontally pivots the arm around a pivot axis positioned at a rear side of the substrate placement regions and moves the pivot axis in the left-and-right direction; and a controller that outputs a control signal to convey the nozzle from the nozzle placement region to a standby position corresponding to a processing position of a conveyance destination among standby positions set corresponding to the processing positions, from a rear side, cause the nozzle to stand by at the standby position, and then, convey the nozzle to the processing position. The standby position is outside the substrate placement regions and is located between the processing position and the nozzle placement region when viewed in a front-and-rear direction.

In the above-described liquid processing apparatus, the nozzle is connected with a pipe that supplies the processing liquid to the nozzle, and the pipe is provided to extend along the left-and-right direction from the nozzle positioned in the nozzle placement region such that deformation of the pipe is suppressed when the nozzle is positioned in the nozzle placement region rather than the processing position.

In the above-described liquid processing apparatus, a plurality of nozzles are provided and selectively held by the arm.

In the above-described liquid processing apparatus, the controller outputs a control signal to cause the nozzle held by the arm to stand by at a rear side standby position set at a rear side of the substrate standby position before the nozzle is conveyed to the standby position.

In the above-described liquid processing apparatus, when the nozzle is conveyed to one of the processing positions, a time during which the nozzle is positioned at the rear side standby position corresponding to the processing position is longer than a time during which the nozzle is positioned at the standby position corresponding to the processing position.

In the above-described liquid processing apparatus, when the nozzle is conveyed to each of the processing positions, the arm is pivoted in the same direction to convey the nozzle.

In another aspect of the present disclosure, there is provided a liquid processing method used in a liquid processing apparatus including: a plurality of substrate placement regions arranged in a left-and-right direction; a nozzle that supplies a processing liquid to a substrate from each processing position on each of the substrate placement regions to process the substrate; a nozzle placement region which is provided behind a row of the substrate placement regions and on which the nozzle is placed; an arm that detachably holds the nozzle at one end side; and a driving unit that horizontally pivots the arm around a pivot axis positioned at a rear side of the substrate placement regions and moves the pivot axis in the left-and-right direction. The liquid processing method includes: conveying the nozzle from the nozzle placement region to a standby position corresponding to a processing position of a conveyance destination among standby positions set corresponding to the processing positions, from a rear side; causing the nozzle to stand by at the standby position; and conveying the nozzle to the processing position. The standby position is outside the substrate placement regions and is located between the processing position and the nozzle placement region when viewed in a front-and-rear direction.

In still another aspect of the present disclosure, there is provided a non-transitory computer-readable storage medium that stores a computer program for use in a substrate processing apparatus for performing a liquid processing on a substrate. The computer program, when executed, causes a computer to execute the liquid processing method described above.

According to the present disclosure, in conveying the nozzle from the nozzle placement region to each processing position by the arm configured to horizontally pivot around the pivot axis that moves in the left-and-right direction, the nozzle is conveyed to a standby position corresponding to a processing position of a conveyance destination among standby positions set corresponding to the processing positions, from a rear side, is caused to stand by at the standby position. Then, the nozzle is conveyed to a front side processing position. Since the conveyance and the standby of the nozzle are performed in this manner, it is possible to suppress the pipe connected to the conveyed nozzle from suddenly largely bending and suppress the bending time from being prolonged. As a result, damage to the pipe may be alleviated. Further, since the nozzle stands by in the vicinity of the substrate placement region rather than the nozzle placement region, the nozzle may be promptly moved from the standby region onto the substrate placement region, so that the decrease in throughput may be suppressed.

A resist coating apparatus 1 as an exemplary embodiment of the liquid processing apparatus of the present disclosure will be described in reference to FIGS. 1, 2, and 3, which are a perspective view, a plan view, and a rear view, respectively, of the resist coating apparatus 1. The resist coating apparatus 1 has a base 11 on which two cups 2 arranged in the left-and-right direction (the X direction in the figure) are provided. Each cup 2 is a processing section that accommodates and processes a wafer W. A thinner and a resist are supplied to the wafer W accommodated in the cup 2, and a processing is performed.

Regarding the resist as a processing liquid, the resist coating apparatus 1 includes ten resist ejection nozzles 41 that eject different kinds of resists such that one selected from ten kinds of resists is supplied to the wafer W to form a resist film thereon. The resist ejection nozzles 41 will be described in detail later. In addition, the thinner is a chemical liquid for pre-wetting to improve the wettability of the resist on the surface of the wafer W.

Figure 4:
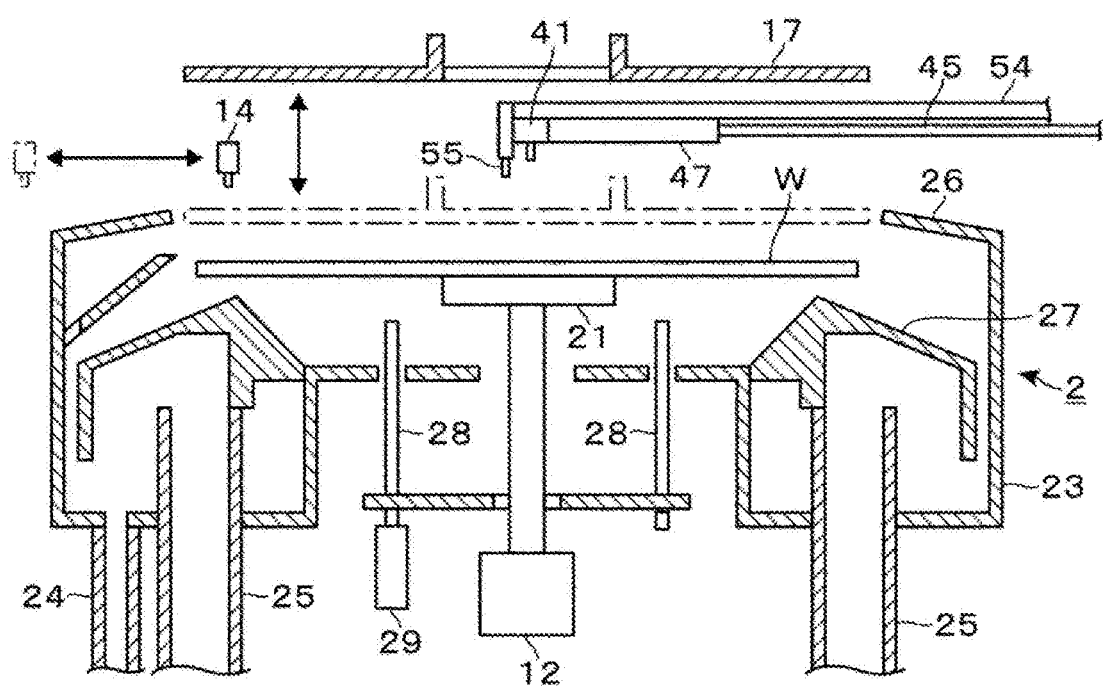
FIG. 4 is a vertical-sectional side view of a cup provided in the resist coating apparatus.

Subsequently, the cup 2 will be described in detail with reference to the vertical-sectional side view of FIG. 4. The cup 2 includes a spin chuck 21 therein, and the cup 2 attracts the central portion of the rear surface of the wafer W and holds the wafer W horizontally. Therefore, the upper side of the spin chuck 21 forms a substrate placement region. The spin chuck 21 is connected to a rotation mechanism 22. The spin chuck is rotated by the rotation mechanism 22, so that the wafer W placed on the spin chuck 21 is rotated around the central axis thereof. After being supplied to the central portion of the front surface of the wafer W, the resist and the thinner are spread on the peripheral portion of the wafer W by the rotation of the wafer W, and are supplied to the entire front surface of the wafer W.

The lower side of the cup 2 is configured as an annular liquid receiving portion 23 such that its vertical-sectional side surface has a recessed shape, and a drain path 24 is connected to the liquid receiving portion 23. In the figure, reference numeral 25 denotes an exhaust pipe for exhausting an atmosphere inside the cup 2. In the figure, reference numeral 26 denotes an inclined wall that extends toward the upper inner side of the cup 2. In the figure, reference numeral 27 denotes a guide member, which is provided with an inclined surface that descends toward the outside of the wafer W at the lower side of the wafer W. The inclined wall 26 and the guide member 27 receive the processing liquid scattered or overflowing from the rotating wafer W. The received processing liquid is then guided to the liquid receiving portion 23 and removed therefrom. In the figure, reference numeral 28 denotes each of three lift pins (only two are illustrated in FIG. 4). The lift pins 28 are moved up and down by a lift mechanism 29, and deliver the wafers W between a conveyance mechanism of the wafer W (not illustrated) and the spin chuck 21.

In the following descriptions, regarding the above-mentioned two cups 2, one cup may be denoted by reference numeral 2A and the other cup may be denoted by reference numeral 2B. Further, in the following descriptions, the direction in which the cup 2A is positioned on the right side and the cup 2B is on the left side in the front-and-rear direction (Y direction in FIGS. 1 and 2) of the resist coating apparatus 1 will be regarded as the front.

Two film removal mechanisms 12 and two rectification mechanisms 13 are provided on the base 11 so as to correspond to the cups 2A and 2B, respectively. The film removal mechanism 12 corresponding to the cup 2A is constituted by a film removal nozzle 14, a moving mechanism 15, and a standby portion 16. The film removal nozzle 14 locally ejects a thinner to a peripheral portion of the wafer W, on which a resist film is formed, to remove a resist film from the peripheral portion. The moving mechanism 15 moves the film removal nozzle 14 in the left-and-right direction and in the up-and-down direction. The standby portion 16 is formed in a cup shape so as to accommodate the film removal nozzle 14, and is provided on the right side of the cup 2A when viewed toward the front side. The film removal nozzle 14 is moved between the peripheral portion of the wafer W accommodated in the cup 2A and the standby portion 16 by the moving mechanism 15. The film removal mechanism 12 corresponding to the cup 2B has the same configuration as that of the film removal mechanism 12 corresponding to the cup 2A, except that the standby portion 16 is provided on the left side of the cup 2B when viewed toward the front side, and the film removal nozzle 14 is moved between the peripheral portion of the wafer W in the cup 2B and the standby portion 16.

Subsequently, the rectification mechanism 13 corresponding to the cup 2A will be described. The rectification mechanism 13 is constituted by a plate 17 disposed above the opening of the cup 2A and a lift mechanism 18 provided on the right side of the cup 2A when viewed towards the front side. The plate 17 is formed in a circular ring shape along the circumference of the wafer W in a plan view. The lift mechanism 18 is provided on the right side of the cup 2A and lifts up and down the plate 17 between a lift-up position indicated by a solid line in FIG. 4 and a lift-down position indicated by a chain line.

When the resist is applied to the entire front surface of the wafer W and then the wafer W is rotated to dry the resist, the plate 17 is disposed at the lift-down position to rectify the airflow above the peripheral portion of the wafer W. This rectifying action suppresses abnormal film thickness of the resist film on the peripheral portion. The plate 17 is positioned at the lift-up position so as not to interfere with the movement of the arm 54 and the conveyance of the wafer W, which will be described later, except for the period during which the resist is thus dried. The rectification mechanism 13 corresponding to the cup 2B has the same configuration as that of the rectification mechanism 13 corresponding to the cup 2A, except that the plate 17 is disposed above the opening of the cup 2B, and the lift mechanism 18 is provided on the left side of the cup 2B when viewed toward the front side.

Figure 5:
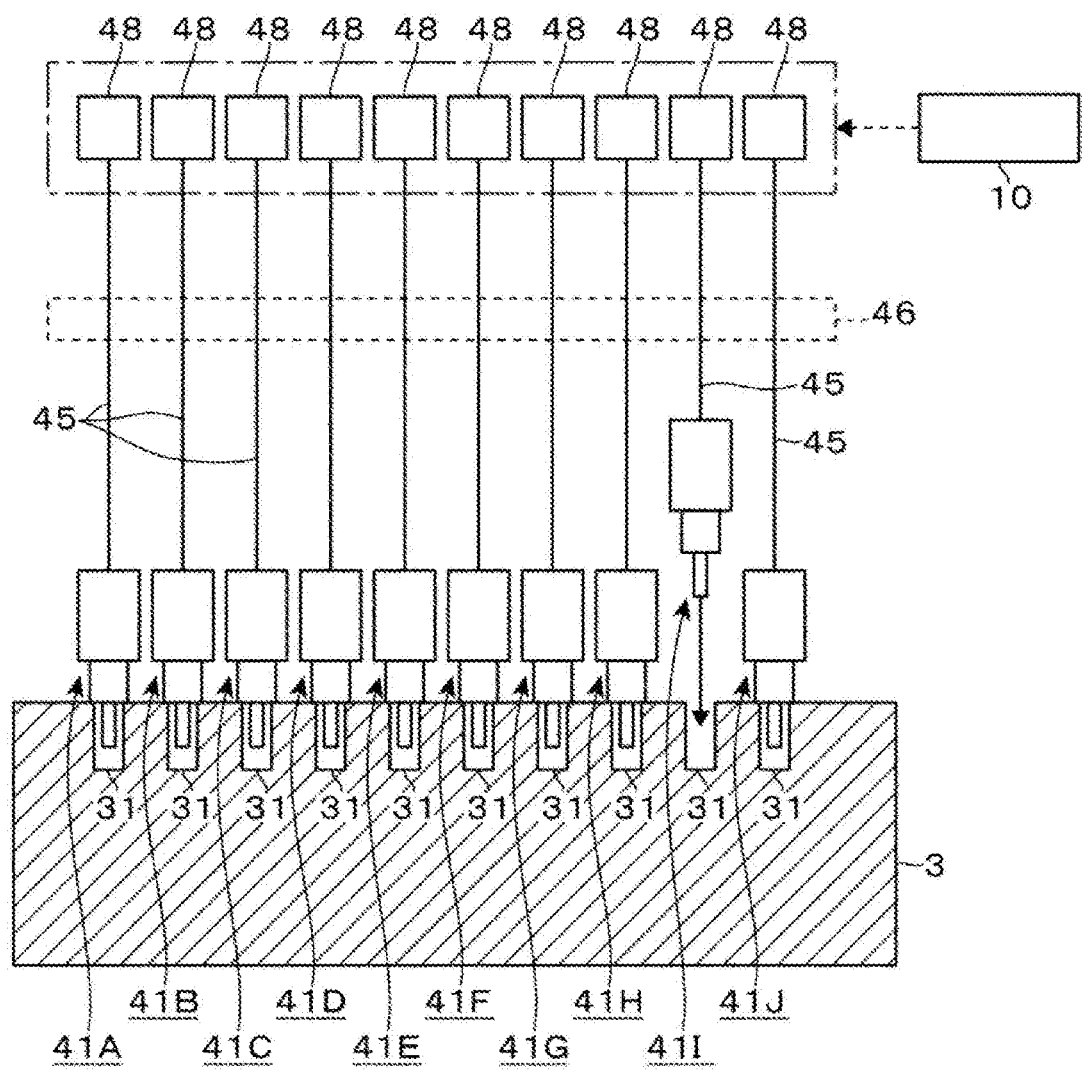
FIG. 5 is a vertical-sectional side view of a nozzle standby section provided in the resist coating apparatus.

A nozzle placing portion 3 is provided on the rear side of the row of the cups 2 on the base 11. The nozzle placing portion 3 is configured as an elongated base along the Y direction. Referring also to FIG. 5 which is a schematic vertical-sectional side view of the nozzle placing portion 3, ten recesses 31 are arranged in the front-and-rear direction on the upper portion of the nozzle placing portion 3. Ten resist ejection nozzles 41 are placed on the peripheral portions of the recesses 31, respectively, in a state where the tip portion (lower end portion) for ejecting the resist enters each recess 31. Accordingly, each recess 31 is configured as a placement region of each of the resist ejection nozzles 41. The recess 31 into which each of the resist ejection nozzles 41 is to enter is determined in advance. That is, the placement region in the nozzle placing portion 3 is determined in advance for each of the resist ejection nozzles 41. Hereinafter, the resist ejection nozzles may be denoted by reference numerals 41A, 41B, 41C, . . . 41H, 41I, and 41J in order from the one placed on the front side of the nozzle placing portion 3 to the one placed on the rear side.

Figure 6:
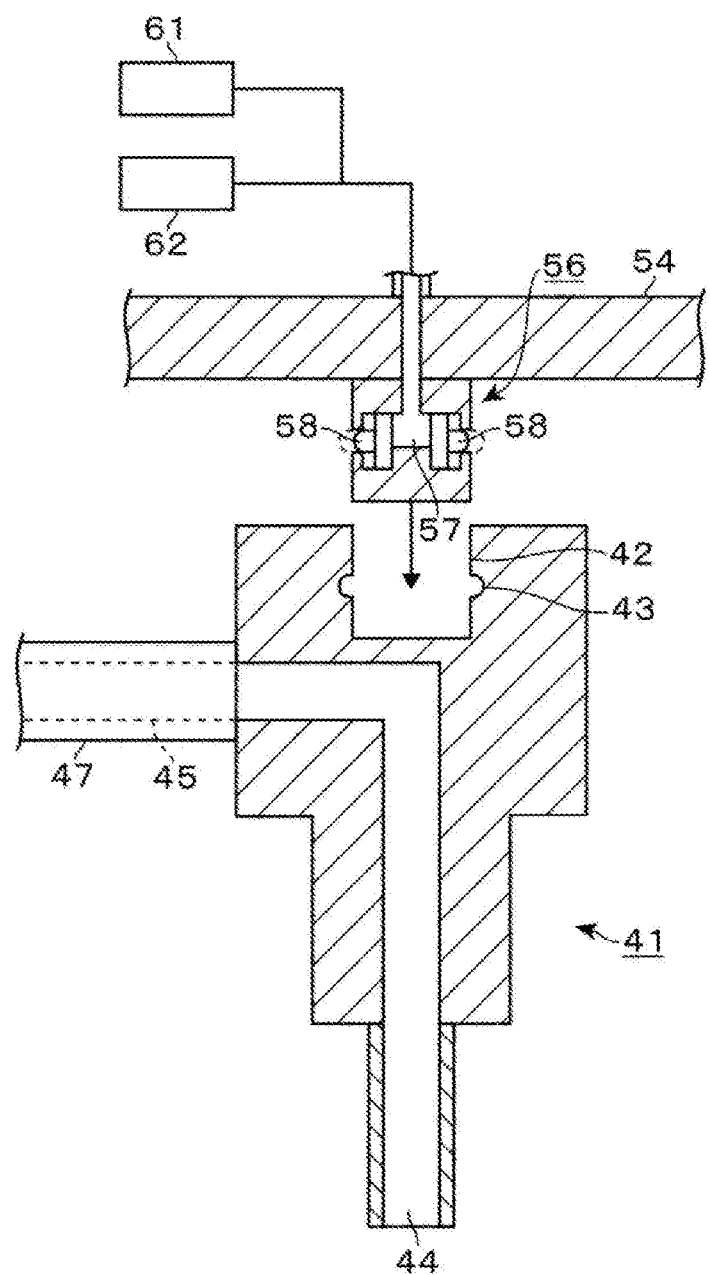
FIG. 6 is a vertical-sectional side view of a resist ejection nozzle and a nozzle holding unit provided in the resist coating apparatus.

The resist ejection nozzles 41 will be further described with reference to the vertical-sectional side view of FIG. 6. Circular recesses 42 are formed downward in the upper portion of the resist ejection nozzles 41 to hold the resist ejection nozzles 41 by an arm 54 (to be described later). On the side surface of each of the recesses 42, a plurality of engaging recesses 43 are formed in the circumferential direction toward the lateral side. In the figure, reference numeral 44 denotes an ejection port of each of the resist ejection nozzles 41, which is opened so as to eject the resist vertically downward.

The downstream ends of pipes 45 are connected to the resist ejection nozzles 41A to 41J, respectively. When the resist ejection nozzles 41 on standby in the nozzle placing portion 3 are viewed from the rear side toward the front side as illustrated in FIG. 3, the downstream ends of the respective pipes 45 are connected from the right side of the resist nozzles 41. In addition, the upstream side of the pipes 45 extends from the resist ejection nozzles 41 toward the right side and then toward the lower side, is routed so as to further extend to the left side, and is fixed on the base 11 by a fixing portion 46. In the figure, reference numeral 47 denotes an outer casing that surrounds each of the pipes 45 in the vicinity of each of the resist ejection nozzles 41 and prevents deformation of the pipe 45 in the vicinity of the nozzle 41. Each of the pipes 45 has flexibility in a portion between a position upstream of the position where the outer casing 47 is provided and a position where the fixing portion 46 is provided.

The upstream end of each of the pipes 45 is connected to a resist supply mechanism 48 illustrated in FIG. 5. The resist supply mechanism 48 includes, for example, a valve, a pump, and a resist, and may perform pressure feed of the resist stored in a tank to the resist ejection nozzle 41 and stop the pressure feed. Different kinds of resists are stored in the tanks of the resist supply mechanisms 48 such that different kinds of resists are ejected from the resist ejection nozzles 41A to 41J.

Subsequently, a nozzle conveyance mechanism 5 for conveying the resist ejection nozzles 41 will be described. As illustrated in FIGS. 1 to 3, the nozzle conveyance mechanism 5 includes a guide 51, a horizontal movement portion 52, a lift mechanism 53, and an arm 54. The guide 51 is laid along the left-and-right direction on the rear side of the nozzle placing portion 3, and the horizontal movement portion 52 is configured to be horizontally movable along the guide 51 in the left-and-right direction. The lift mechanism 53 is provided to extend from the lateral side of the horizontal movement portion 52 toward the front side, and the horizontal movement portion 52 is configured to vertically move up and down the lift mechanism 53. The lift mechanism 53 is able to pivot (rotate) the arm 54 around a vertical pivot axis R provided on the tip end side of the lift mechanism 53. That is, the arm 54 is pivoted horizontally around the pivot axis R. The pivot axis R is positioned on the rear side of the row of the cups 2. Further, the guide 51, the horizontal movement portion 52, and the lift mechanism 53 constitute a driving unit of the arm 54.

A thinner ejection nozzle 55 is provided at the tip end portion of the arm 54 to eject a thinner vertically downward. Further, a holder 56 is provided in the lower portion of the tip end side of the arm to let the arm 54 to selectively hold one of the resist ejection nozzles 41A to 41J. The holder 56 is configured as a circular protrusion protruding downward and is able to enter into the recess 42 of the resist ejection nozzle 41 described above. The holder 56 will be described with reference to FIG. 6. In the figure, reference numeral 61 denotes a gas supply unit that supplies a gas to an internal space 57 provided in the holder 56, and reference numeral 62 denotes an exhaust unit that exhausts the atmosphere in the internal space 57. By the gas supply and the exhaust, a state where the pressure in the internal space 57 is relatively high and a state where the pressure in the internal space 57 is relatively low are switched with each other. A plurality of engaging protrusions 58 are provided on the side surface of the holder 56 in the circumferential direction so as to switch between a state protruding from the side surface of the holder 56 and a state sinking from the side surface of the holder 56 by the switching of the pressure state.

As the engaging protrusions 58 protrude or sink in that manner in a state where the holder 56 enters into the recess 42 of the resist ejection nozzle 41, a state where the engagement is formed between the engaging protrusions 58 and the engaging recesses 43 of the resist ejection nozzle 41 and a state where the engagement is released are switched. That is, the state where the engagement is formed between the arm 54 and the resist ejection nozzle 41 and the state where the engagement is released are switched. When the engagement is formed between the arm 54 and the resist ejection nozzle 41, the arm 54 holds the resist ejection nozzle 41 so that the resist ejection nozzle 41 is conveyed between the nozzle placing portion 3 and the wafers W accommodated in the cup 2A and 2B.

Meanwhile, when the position at which the resist ejection nozzle 41 ejects the resist on the central portion of the wafer W in each of the cups 2A and 2B is set as a processing position, a standby position is set for causing the nozzle 41 to stand by before the nozzle 41 is conveyed to each processing position. That is, a standby position corresponding to the processing position of the cup 2A and a standby position corresponding to the processing position of the cup 2B are set, and denoted by reference numerals 20A and 20B in FIGS. 2 and 3, respectively. The standby positions 20A and 20B are set outside the cups 2A and 2B. Further, the standby positions 20A and 20B are located on the front side of the placement region of each resist ejection nozzle 41 of the nozzle placing portion 3 and on the rear side of the corresponding processing position.

Figure 7:
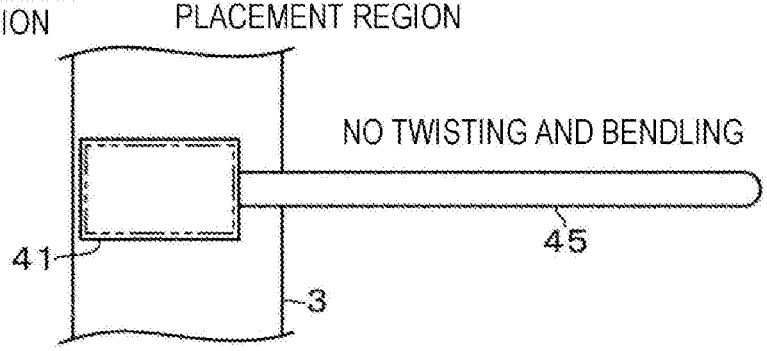
FIG. 7 is a schematic plan view illustrating a pipe connected to the resist ejection nozzle.
Figure 7:
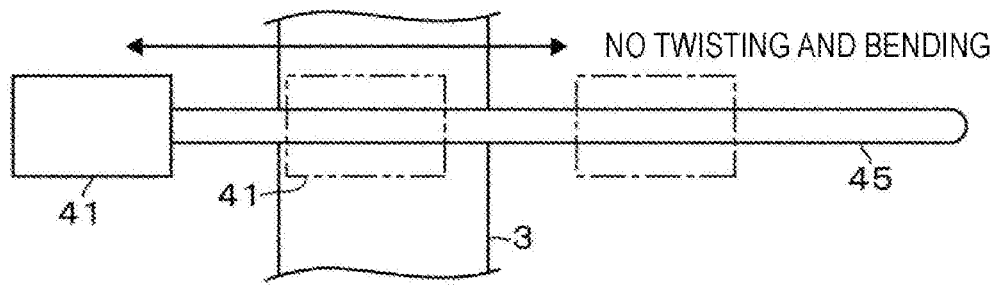
Figure 7:
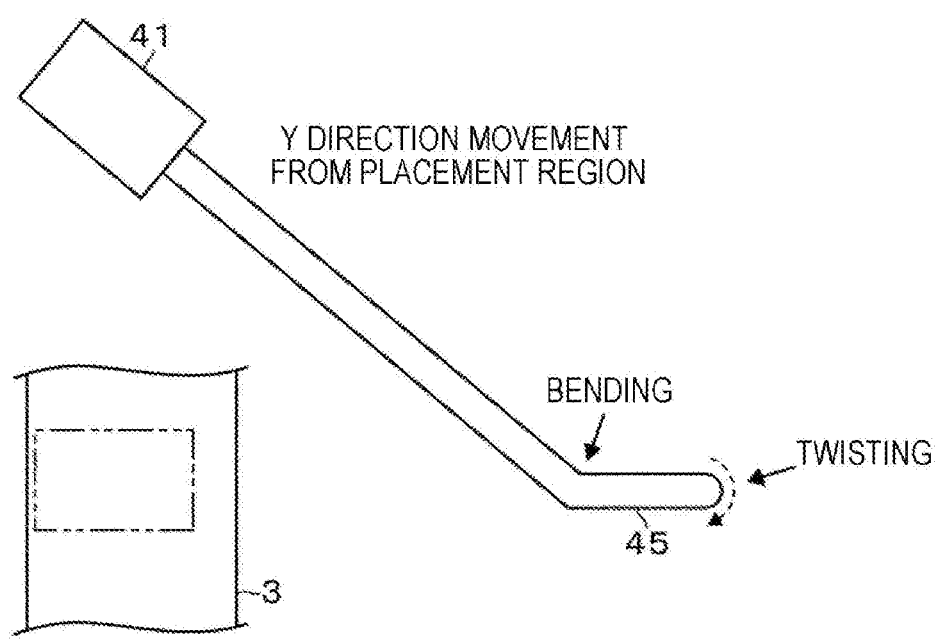
Figure 8:
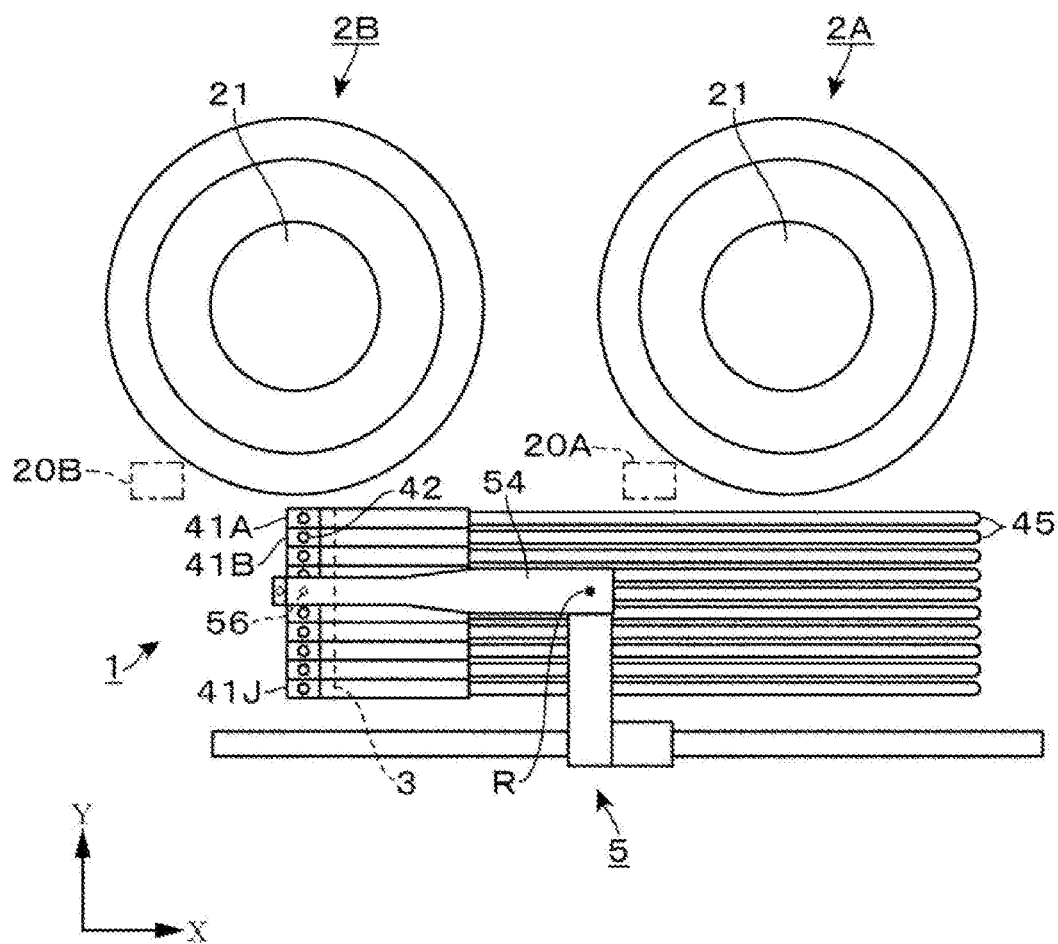
FIG. 8 is a schematic plan view of the resist coating apparatus.

The reason that the standby positions 20A and 20B are set will be described with reference to FIG. 7 which is a schematic plan view of the resist ejection nozzle 41 and the pipe 45 connected to the nozzle 41. In FIG. 7, for the sake of explanation, illustration of, for example, the outer casing 47 of the pipe 45 is omitted, and the placement region of the nozzle placing portion 3 set for the resist ejection nozzle 41 is indicated by a two-dot chain line.

As described above, the pipe 45 is routed along the X direction, and the upstream side spaced away from the resist ejection nozzle 41 by the fixing portion 46 is fixed on the base 11. Thus, when the nozzle 41 is positioned in and above the placement region, twisting and bending in a plan view does not occur in the pipe 45, as illustrated in the upper part of FIG. 7. Similarly, even in a case where the resist ejection nozzle 41 is not displaced in the Y direction (front-and-rear direction) with respect to the placement region but is displaced only in the X direction (left-and-right direction), twisting and bending in a plan view does not occur in 45, as illustrated in the middle part of FIG. 7.

However, since the routing and fixing are performed as described above, when the resist ejection nozzle 41 is displaced in the Y direction with respect to the placement region, twisting and bending in a plan view occur in the pipe, as illustrated in the lower part of FIG. 7. That is, when the resist ejection nozzle 41 held by the arm 54 is conveyed from the placement region toward the front cups 2A and 2B by the pivoting motion of the arm 54, such twisting and bending in a plan view occur.

Further, when the resist ejection nozzle 41 moves from the placement region to the front side as described above, the downstream side of the pipe 45 connected to the resist ejection nozzle 41 also moves to the front side and rubs against the pipe 45 connected to another resist ejection nozzle 41 placed on the nozzle placing portion 3. The standby positions 20A and 20B are set to allow the resist ejection nozzles 41 which are respectively conveyed to the processing position of the cup 2A and the processing position of the cup 2B to stand by, that is, temporarily stop, thereby suppressing sudden occurrence of such a twist of the pipe 45, and a bending and rubbing in a planar view, and reducing damage of each pipe 45.

Figure 2:
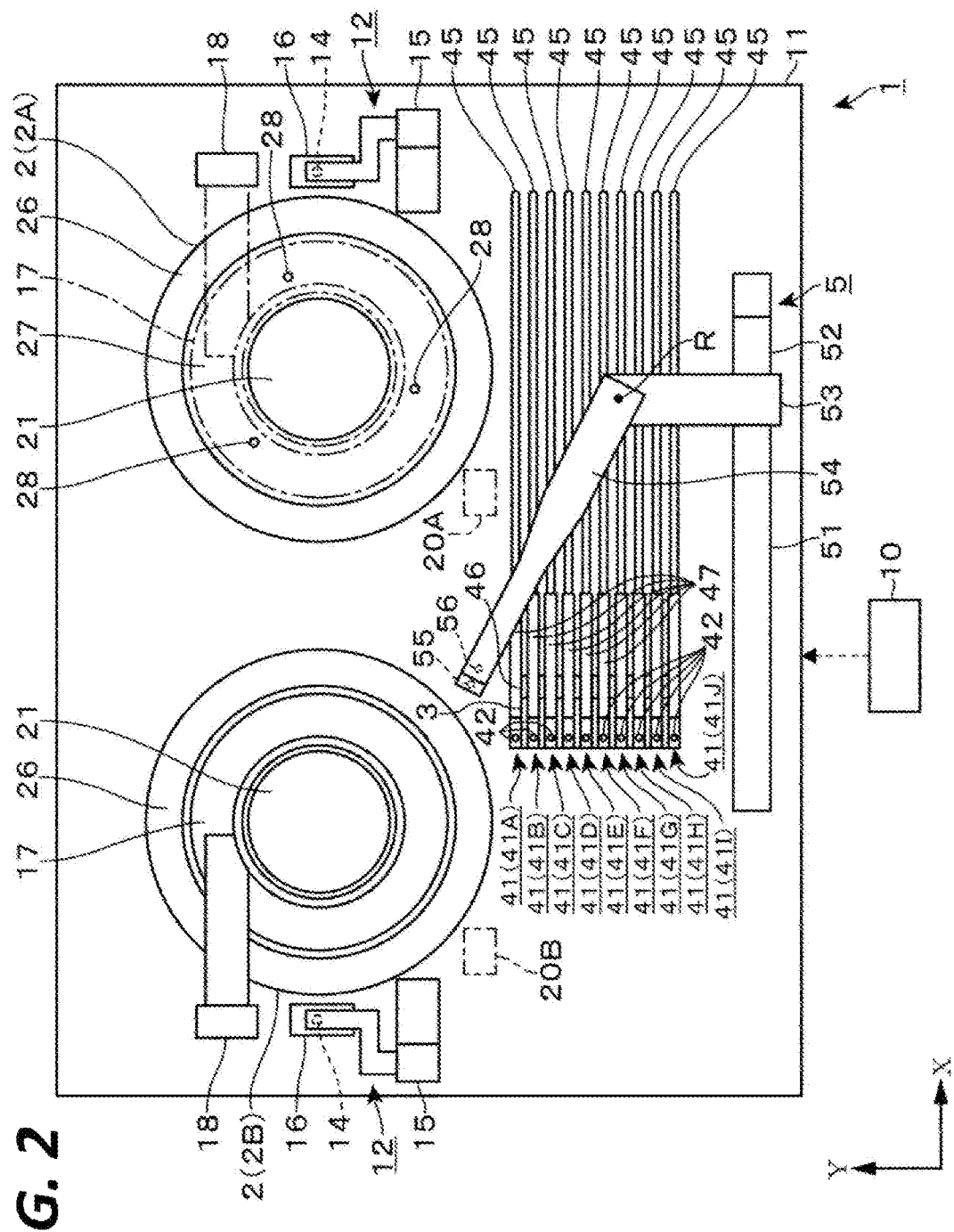
FIG. 2 is a plan view of the resist coating apparatus.
Figure 3:
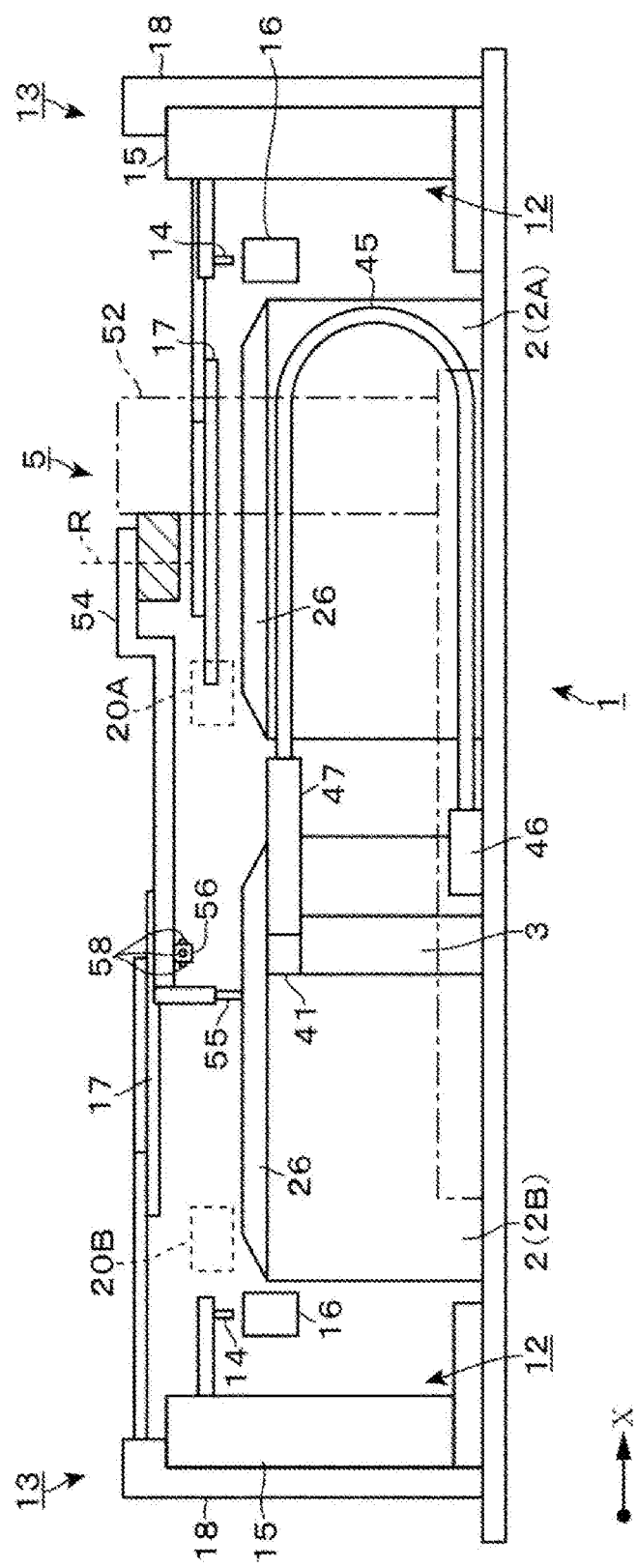
FIG. 3 is a side view of the resist coating apparatus.

As illustrated in FIG. 2, the resist coating apparatus 1 is provided with a controller 10 including a computer. The controller 10 has a program storage unit (not illustrated). The program storage unit stores a program in which commands are organized to perform a processing to be described later on the wafer W. As the program is read out to the controller 10, the controller 10 outputs a control signal to each unit of the resist coating apparatus 1. Therefore, operations such as, for example, the conveyance of the resist ejection nozzle 41 by the nozzle conveyance mechanism 5, the supply of resist by each resist supply mechanism 48, the lift of the lift pins 28 by the lift mechanism 29, the lift of the plate 17 of the rectification mechanism 13 are performed. Thus, a processing may be performed on the wafer W as described later. The program is stored in the program storage unit in a state of being stored in a storage medium such as, for example, a hard disk, a compact disk, a magneto optical disk, or a memory card.

Figure 18:
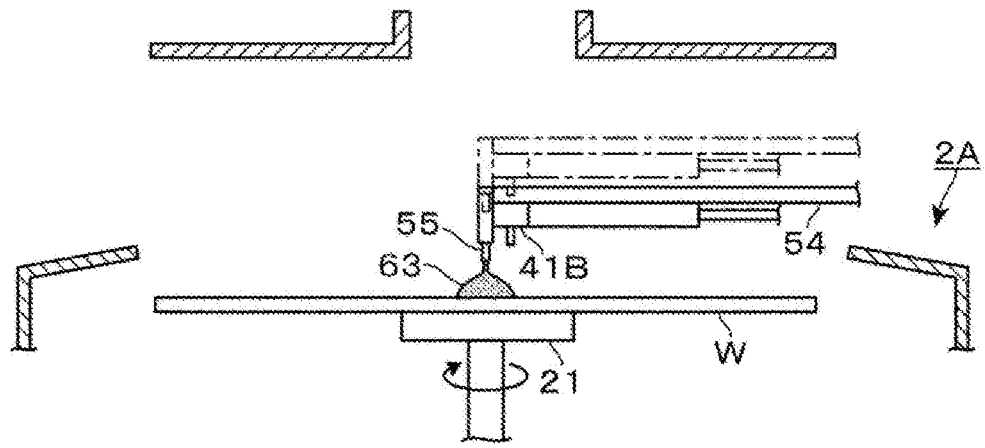
FIG. 18 is a side view of a wafer processed in the cup.
Figure 19:
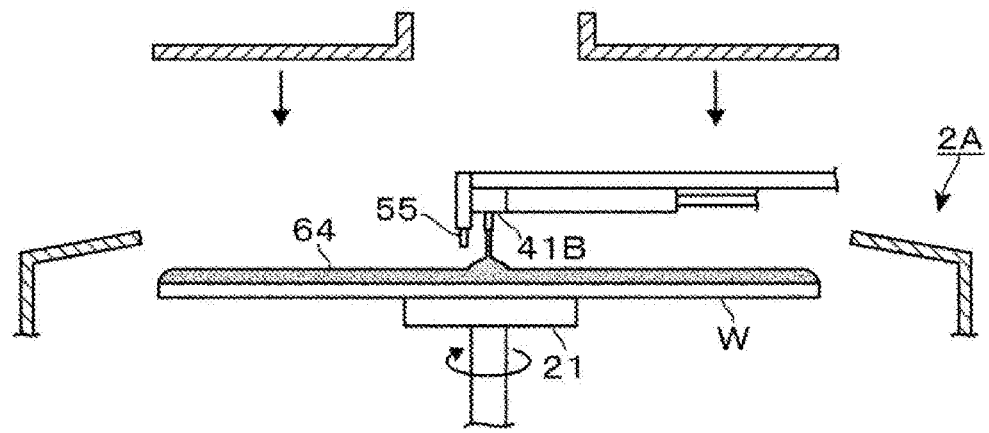
FIG. 19 is a side view of a wafer processed in the cup.

Subsequently, an exemplary processing by the resist coating apparatus 1 will be described with reference to FIGS. 8 to 17 which are plan views of the resist coating apparatus 1 and FIGS. 18 to 20 which are side views of the wafer W in the cup 2A. In the exemplary processing, the wafers W, which are set to be processed by the resist ejected from the resist ejection nozzle 41B, are alternately conveyed to the cups 2A and 2B in this order, and the processing is performed on the wafers W in the conveyance order. In FIGS. 8 to 17, the conveyance path of the resist ejection nozzle 41B conveyed by the arm 54 is illustrated using arrows. Since these FIGS. 8 to 17 are schematic views for explaining the operation of the arm 54, illustration of, for example, the film removal mechanism 12 and the rectification mechanism 13 are omitted.

Figure 9:
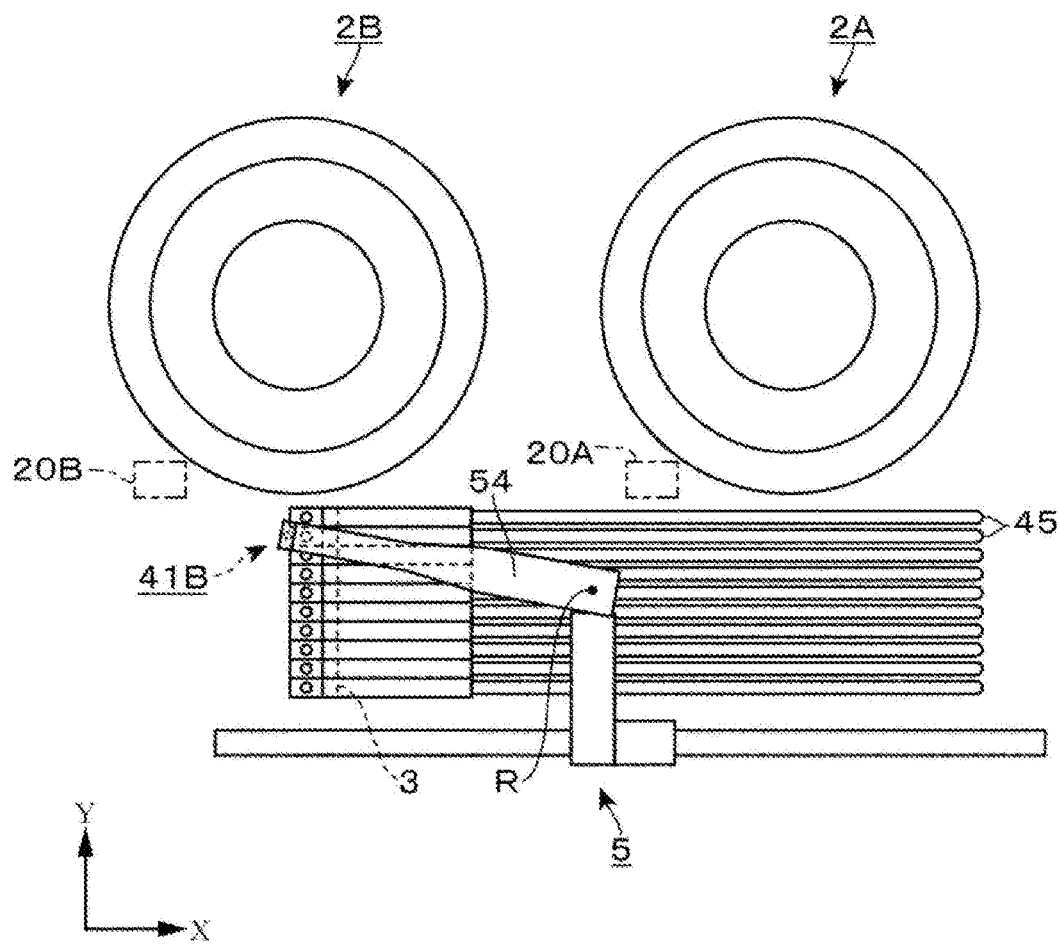
FIG. 9 is a schematic plan view of the resist coating apparatus.

First, in a state where each resist ejection nozzle 41 is positioned in each placement region of the nozzle placing portion 3 (FIG. 8), the X direction movement and the pivot of the arm 54 of the nozzle conveyance mechanism 5 are performed in parallel, so that the holder 56 of the arm 54 is positioned above the recess 42 of the resist ejection nozzle 41B. Subsequently, the arm 54 is moved down so that the holder 56 enters the recess 42 to form engagement between the resist ejection nozzle 41B and the arm 54. Thus, the resist ejection nozzle 41B is held by the arm 54 (FIG. 9).

Figure 10:
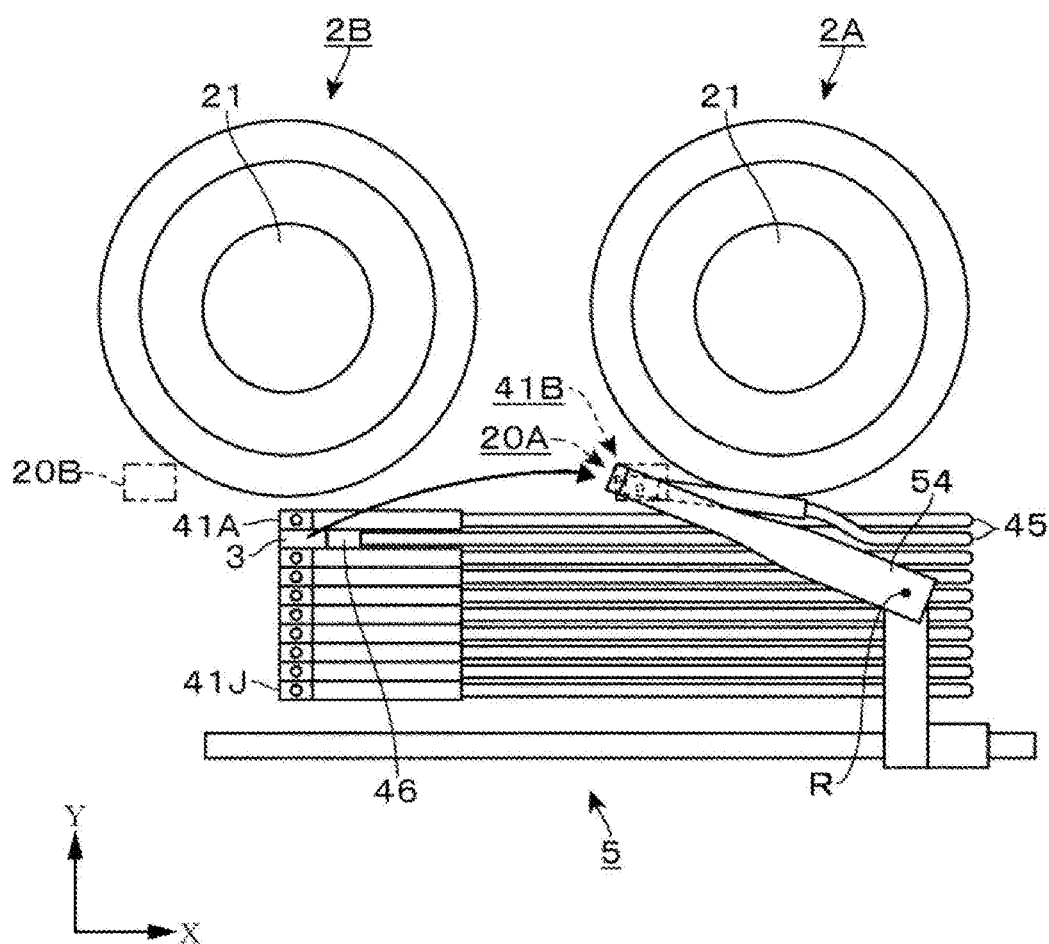
FIG. 10 is a schematic plan view of the resist coating apparatus.

Thereafter, the arm 54 is moved up, and the X direction movement and the clockwise pivot of the arm 54 are performed in parallel. Thus, the resist ejection nozzle 41B is conveyed toward the standby position 20A, for example, so as to pass outside the cups 2A and 2B in a plan view. Then, when the resist ejection nozzle 41B is conveyed to the standby position 20A, the operation of the arm 54 is stopped. That is, the resist ejection nozzle 41B is in a standby state (stationary state) at the standby position 20A (FIG. 10).

Figure 11:
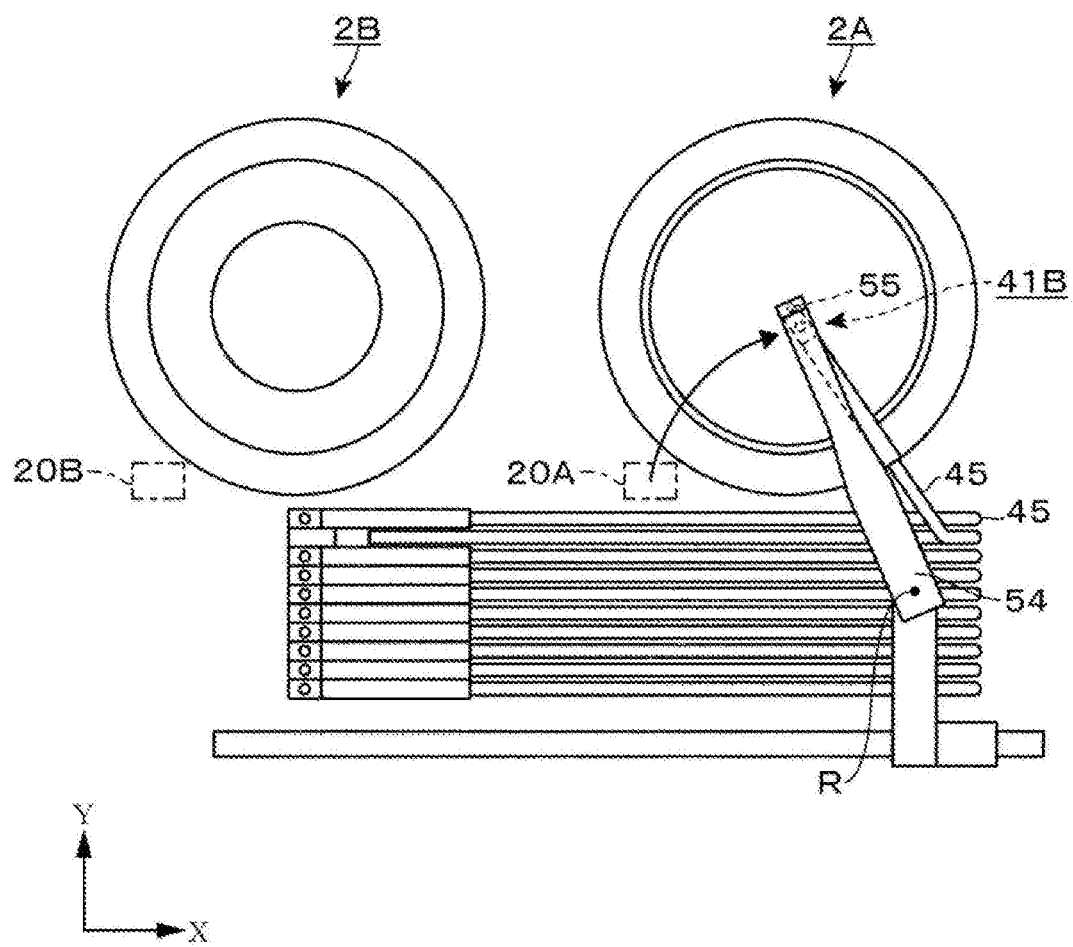
FIG. 11 is a schematic plan view of the resist coating apparatus.

For example, when a wafer W is conveyed into the cup 2A and placed on the spin chuck 21 while the resist ejection nozzle 41B is on standby, the arm 54 is pivoted clockwise in a plan view, and the thinner ejection nozzle 55 is positioned on the central portion of the wafer W of the cup 2A. Then, the pivot of the arm 54 is stopped (FIG. 11). Thereafter, when the arm 54 is moved down and reaches a predetermined height, the arm 54 is stopped, and the thinner is ejected from the thinner ejection nozzle 55 to the central portion of the wafer W. The wafer W is rotated (FIG. 18), and the thinner 63 is spread from the central portion of the wafer W to the peripheral portion by a centrifugal force, thereby performing pre-wetting.

Then, the ejection of the thinner 63 is stopped, and the X direction movement and the pivot of the arm 54 are performed in parallel. The resist ejection nozzle 41B is positioned at the processing position on the central portion of the wafer W and is stopped (FIG. 12), so that the resist 64 is ejected from the resist ejection nozzle 41B to the central portion of the wafer W. The resist 64 is spread from the central portion of the wafer W to the peripheral portion by the centrifugal force of the rotation of the wafer W (FIG. 19).

Figure 13:
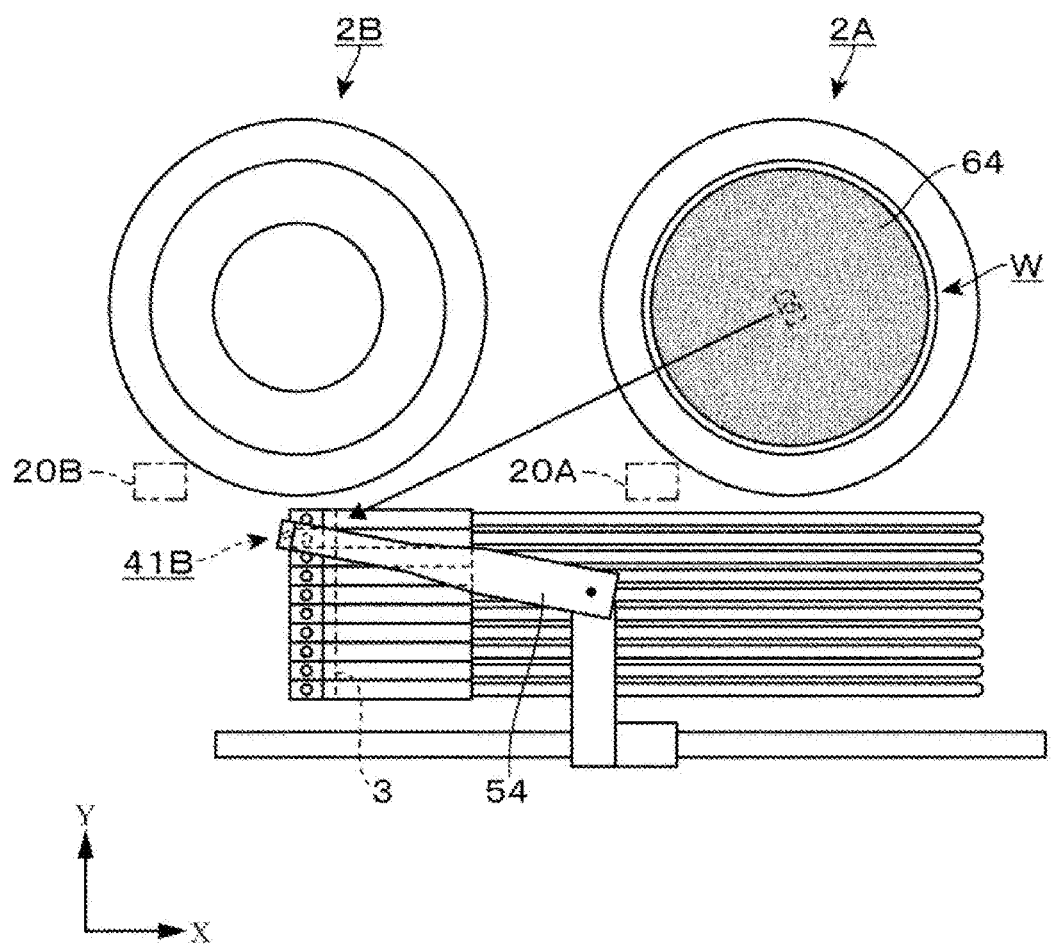
FIG. 13 is a schematic plan view of the resist coating apparatus.
Figure 14:
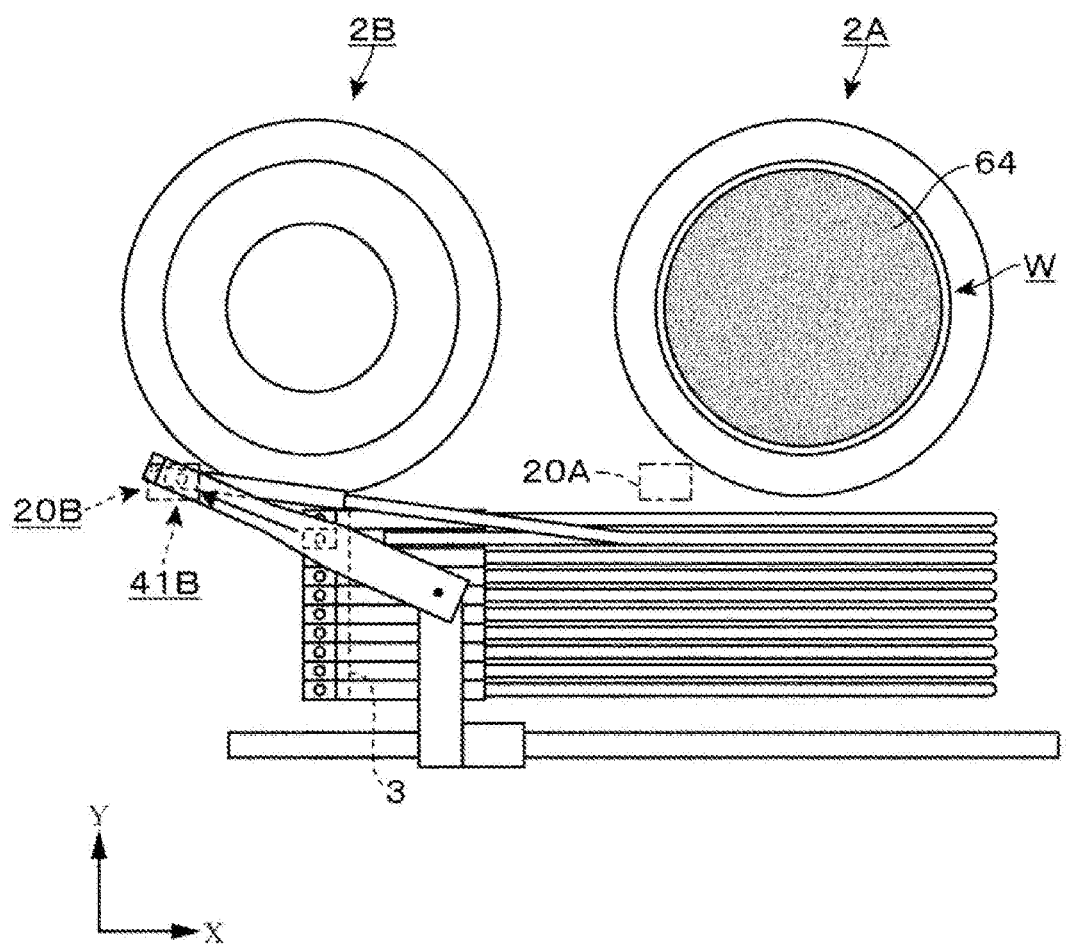
FIG. 14 is a schematic plan view of the resist coating apparatus.

Thereafter, the ejection of the resist 64 is stopped and the arm 54 is moved up. Then, for example, the X direction movement of the arm 54 and the counterclockwise pivot thereof in a plan view are performed in parallel, and the resist ejection nozzle 41B is conveyed above the placement region of the nozzle 41B in the nozzle placing portion 3 so as to pass outside the cup 2B in a plan view (FIG. 13). Thereafter, the X direction movement of the arm 54 and the clockwise pivot of the arm 54 in a plan view are performed in parallel, and the resist ejection nozzle 41B is conveyed toward the standby position 20B. When the resist ejection nozzle 41B is conveyed to the standby position 20B, the operation of the arm 54 is stopped. That is, the resist ejection nozzle 41B is in a standby state at the standby position 20B (FIG. 14).

Figure 20:
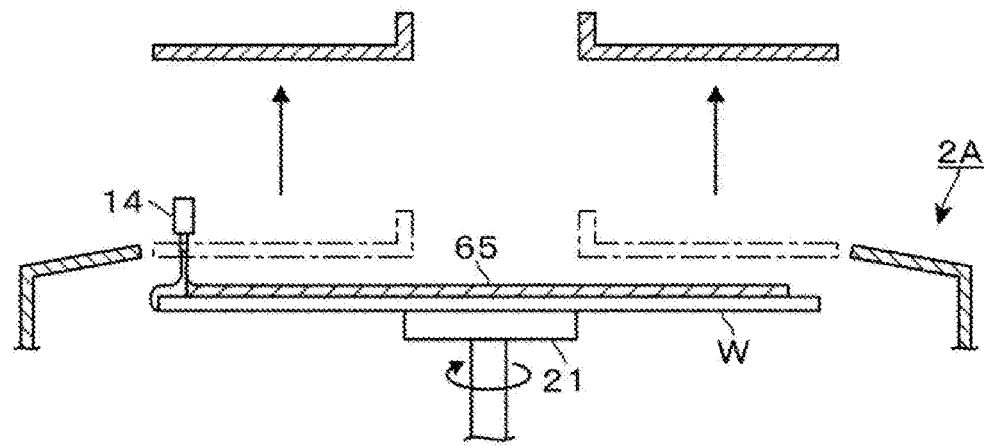
FIG. 20 is a side view of a wafer processed in the cup.

For example, in parallel with the standby of the resist ejection nozzle 41B at the standby position 20B, the rectification of airflow above the peripheral portion of the wafer W caused by the movement from the lift-up position to the lift-down position of the plate 17, the formation of the resist film 65 by drying the resist 64, the movement of the plate 17 from the lift-down position to the lift-up position, the local removal of the resist film 65 in the peripheral portion of the wafer W by ejecting the thinner from the film removal nozzle 14 illustrated in FIG. 20, and the carry-out of the wafer W from the cup 2A by the conveyance mechanism and the lift pins 28 are sequentially performed in the cup 2A.

Figure 15:
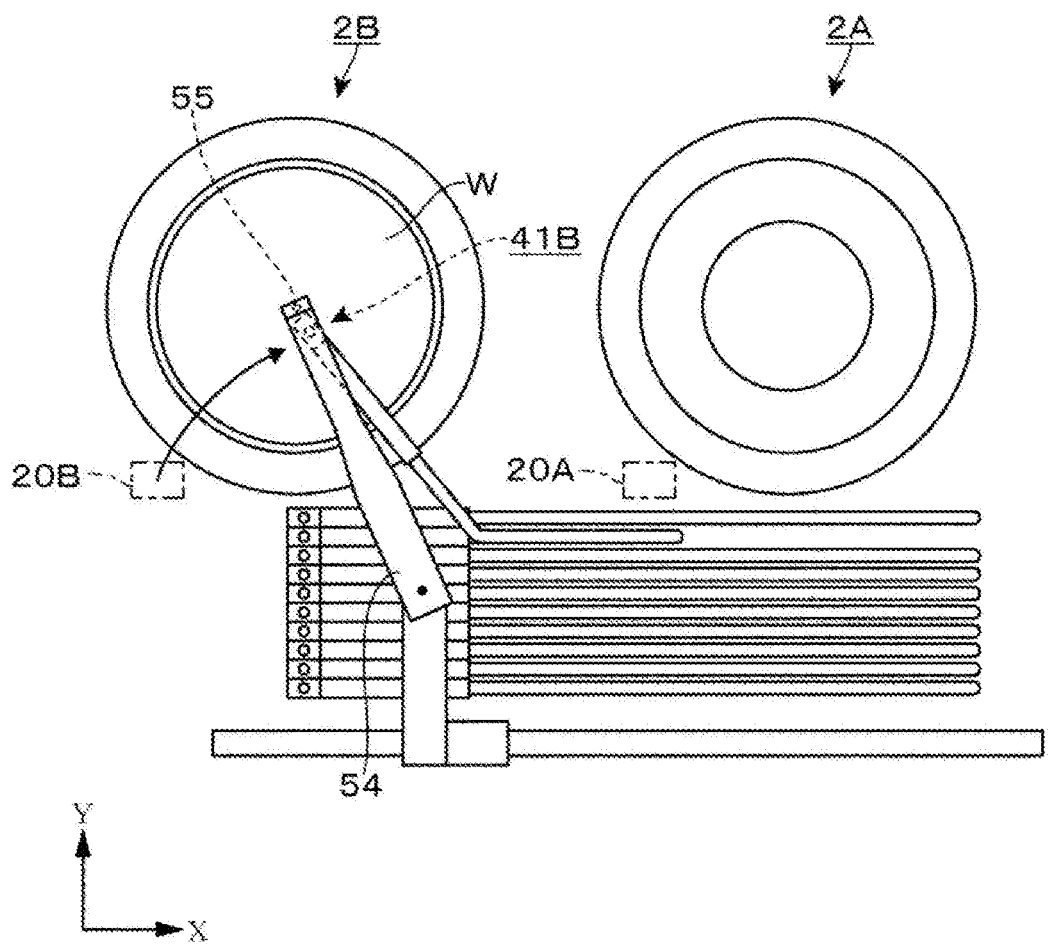
FIG. 15 is a schematic plan view of the resist coating apparatus.
Figure 16:
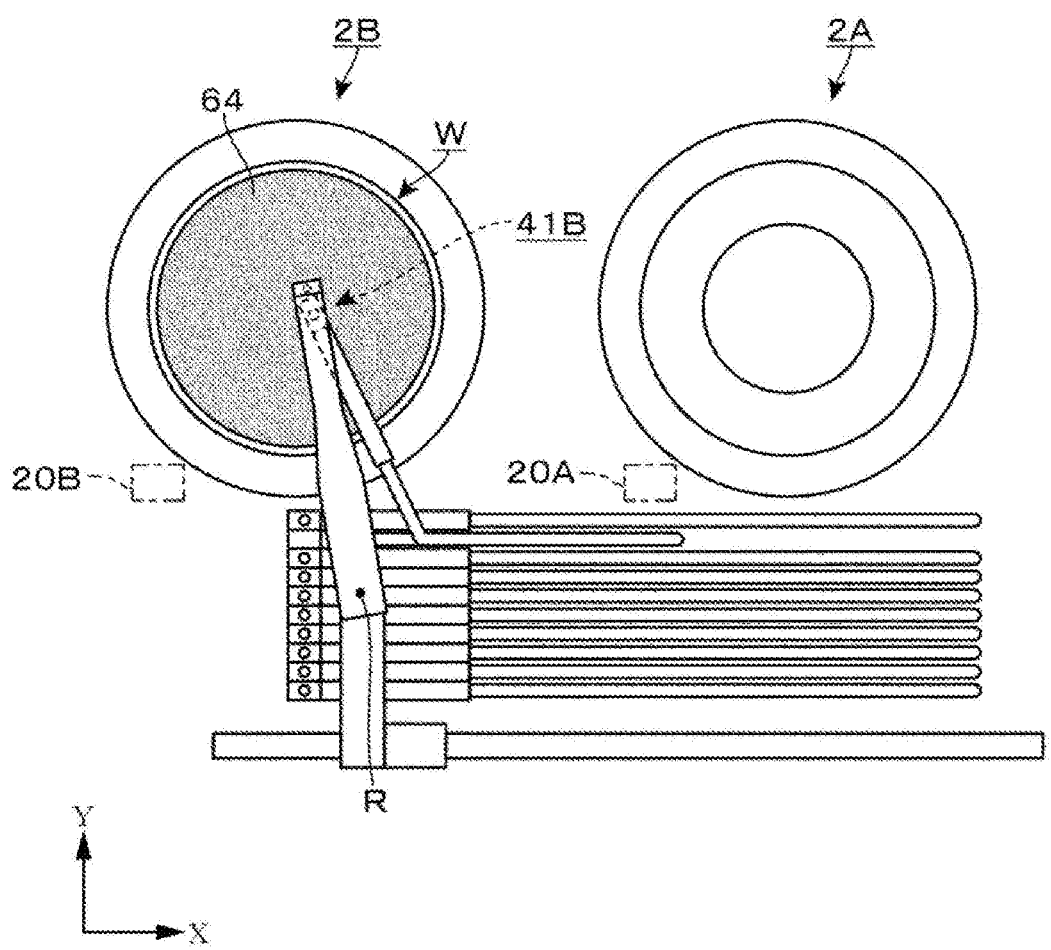
FIG. 16 is a schematic plan view of the resist coating apparatus.

Then, when a wafer W is conveyed into the cup 2B, the arm 54 is pivoted clockwise in a plan view, and the thinner ejection nozzle 55 is positioned on the central portion of the wafer W of the cup 2B. Then, the pivot of the arm 54 is stopped (FIG. 15). Thereafter, the arm 54 is moved down and stopped when it reaches a predetermined height. Thereafter, similarly to the above-described processing of the wafer W in the cup 2A, the pre-wet processing, the movement of the resist ejection nozzle 41B onto the central portion of the wafer W as the processing position, and the ejection of the resist 64 to the rotating wafer W are sequentially performed, and the ejected resist 64 is spread from the central portion of the wafer W to the peripheral portion (FIG. 16).

After the ejection of the resist 64 is stopped, the X direction movement of the arm 54 and the anticlockwise pivot thereof in a plan view are performed in parallel. Then, the resist ejection nozzle 41B is conveyed above the placement region of the nozzle 41B in the nozzle placing portion 3 so as to pass outside the cup 2A in a plan view (FIG. 17), and is then conveyed to the standby position 20A as illustrated in FIG. 10. Similarly to the cup 2A, in the cup 2B, the drying of the resist 64 by the rectification of the plate 17 and the local removal of the resist film 65 by the ejection of the thinner from the film removal nozzle 14 are performed on the wafer W, and then, the wafer W is carried out of the cup 2B.

Figure 17:
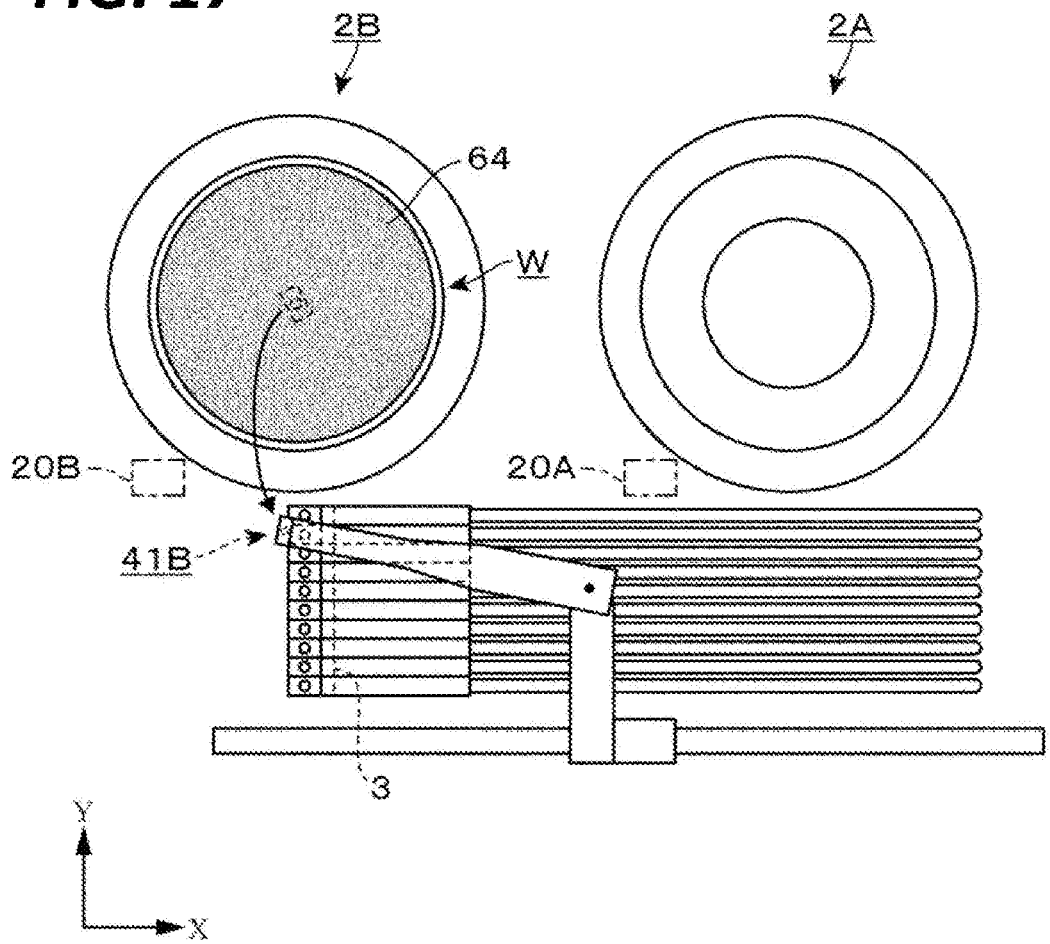
FIG. 17 is a schematic plan view of the resist coating apparatus.

Thereafter, wafers W are sequentially conveyed to the cups 2A and 2B, and, as illustrated in FIGS. 10 to 17, the nozzle 41B is conveyed by the arm 54, thereby performing a processing. Further, for example, when a lot of wafers W to be conveyed to the resist coating apparatus 1 is switched and it becomes necessary to perform a processing by a nozzle 41 other than the nozzle 41B, the moving-down of the arm 54, the placement of the nozzle 41B on the nozzle placing portion 3 by the release of the engagement between the nozzle 41B and the arm 54, and the moving-down of the arm 54 are sequentially performed from a state where the arm 54 is positioned on the placement region, for example, as illustrated in FIGS. 13 and 17. Thereafter, a nozzle 41 other than the nozzle 41B is held by the cooperation of the operations of the respective portions of the arm 54 as in the case where the nozzle 41B is held. Even in the case of performing a processing using a nozzle 41 other than the nozzle 41B, the same operation as that described with reference to FIGS. 8 to 17 is performed.

The time taken from the state illustrated in FIG. 9 where the nozzle 41B is positioned above the placement region in the nozzle placing portion 3 to the state illustrated in FIG. 11 where the nozzle 41B moves above the cup 2A and the pivot of the arm 54 is stopped is, for example, 1.0 second to 2.0 seconds, and more specifically 1.5 seconds. Further, the time taken from the state where the arm 54 starts to be pivoted such that the nozzle 41B is retracted from the cup 2A to the state illustrated in FIG. 13 where the nozzle 41B is positioned above the placement region is, for example, 1.0 second to 2.0 seconds, and more specifically, 1.5 seconds. The time taken from the state illustrated in FIG. 13 where the nozzle 41B is positioned above the placement region to the state illustrated in FIG. 15 where the nozzle 41B moves above the cup 2A and the pivot of the arm 54 is stopped is, for example, 1.0 second to 2.0 seconds, and more specifically 1.5 seconds. Further, the moving up and down of the arm during the processing is performed once, for example, in 1.0 second.

According to the resist coating apparatus 1, the resist ejection nozzles 41 are conveyed from the rear side of the standby positions 20A and 20B set outside the cups 2A and 2B, respectively, at the front side of the nozzle placing portion 3 and the rear side of the central portions of the wafers W where the ejection of the resist is performed, and stand by at the standby positions 20A and 20B. Then, the resist ejection nozzles 41 conveyed to the standby position 20A and 20B are conveyed to the processing position on the central portions of the wafer W of the cup 2A or the processing position on the central portion of the wafer W of the cup 2B, thereby performing a processing. Therefore, compared with the case where the resist ejection nozzles 41 are directly conveyed from the rear side of the standby positions 20A and 20B to the processing positions of the cups 2A and 2B without standing by at the standby positions 20A and 20B, it is possible to suppress sudden deformation (bending and twisting in a plan view) of the pipes 45 connected to the resist ejection nozzles 41 during the conveyance. Furthermore, since the resist ejection nozzles 41 are conveyed from the rear side of the standby positions 20A and 20B where the deformation of the pipes 45 is suppressed as compared with the case where the resist ejection nozzles 41 are positioned at the standby positions 20A and 20B, it is possible to suppress the pipes from being deformed for a long time. Therefore, it is possible to alleviate damage to the pipes 45 and to suppress a decrease in the life of the pipes 45.

Further, the pipes 45 connected to the resist ejection nozzles 41 during the conveyance may be suppressed from suddenly moving greatly by causing the resist ejection nozzles 41 to stand by at the standby positions 20A and 20B as described above, as compared with the case where the resist ejection nozzles 41 are directly conveyed onto the wafers W of the cups 2A and 2B from the rear side of the standby positions 20A and 20B. Thus, it is possible to suppress sudden abrasion of the pipes 45 connected to the resist ejection nozzles 41 in a state where the pipes 45 are placed on the nozzle placing portion 3. Therefore, damage to each pipe 45 may be suppressed even from such a viewpoint. Furthermore, since the standby positions 20A and 20B are set in front of the nozzle placing portion 3, that is, in the vicinity of the cups 2A and 2B, the resist ejection nozzles 41 on standby at the standby positions 20A and 20B may be rapidly moved onto the wafers W. As a result, reduction in the throughput of the resist coating apparatus 1 may be suppressed.

Further, since the standby positions 20A and 20B are set outside the placement region of the wafer W in the cups 2 in a plan view, it is possible to suppress the resist from falling onto the wafer W even though dripping of the resist occurs from the resist ejection nozzles 41 which stand by at the standby positions 20A and 20B. Therefore, it is possible to suppress a decrease in the yield of the wafers W. The standby positions 20A and 20B may be set outside the placement region of the wafers W or may be set to overlap with the cups 2 in a plan view.

In the exemplary processing example, the wafers W are carried into the cups 2A and 2B while the resist ejection nozzles 41 stand by at the standby positions 20A and 20B, but the wafers W are not limited to being carried at such a timing. For example, when nozzles 41 are in a state of being conveyed toward the standby position 20A, an unprocessed wafer W may be carried into the cup 2A and stand by. In the exemplary processing, after a processing by one cup, the resist ejection nozzle is conveyed to a standby region corresponding to the other cup so as not to pass over the other cup. Thus, the wafer W on standby in the other cup is hardly contaminated even when liquid drips from the resist ejection nozzles during the conveyance.

Figure 21:
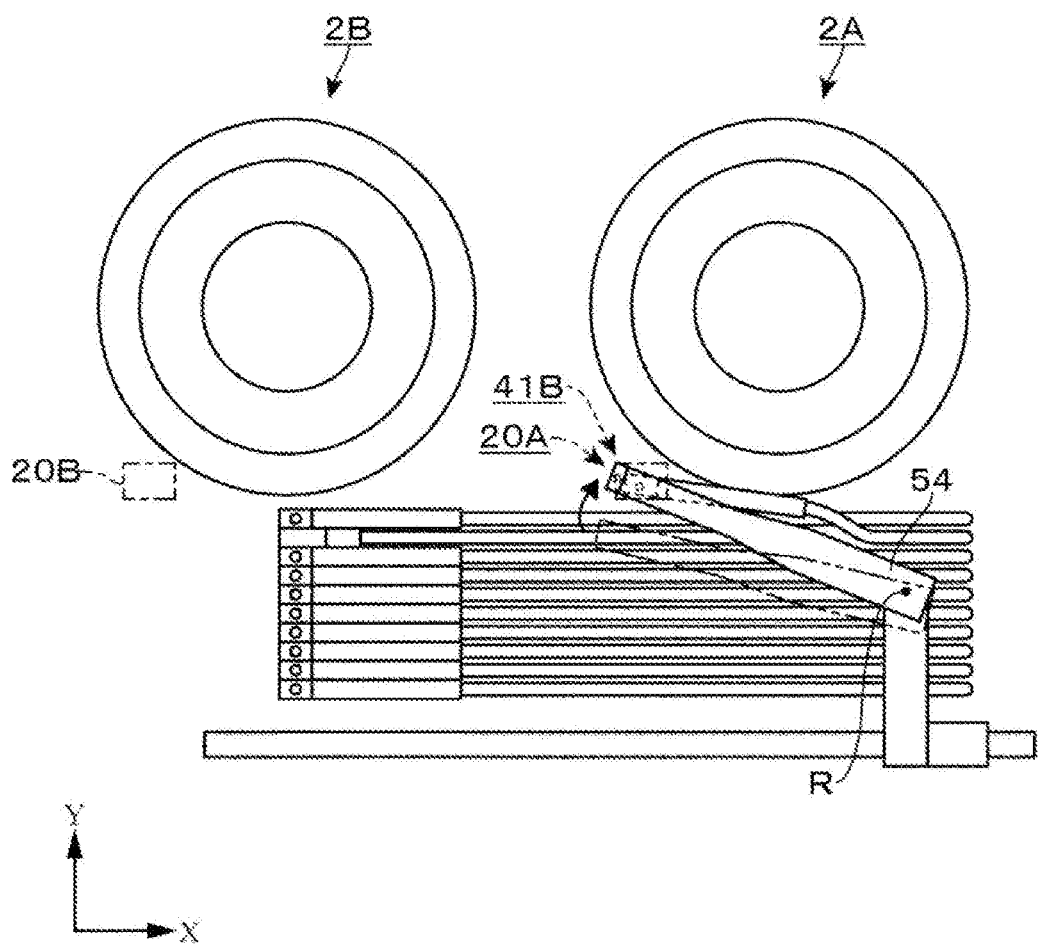
FIG. 21 is a plan view of the resist coating apparatus.

Further, in the exemplary processing, it has been described that the pivot of the arm 54 and the X direction movement of the arm 54 are performed in parallel when the resist ejection nozzles 41 are conveyed to the standby positions 20A and 20B. However, the pivot and the X direction movement may be performed at different timings. Specifically, as illustrated in FIG. 9, in the case where the nozzle 41B held by the arm 54 is conveyed to the standby position 20A, the pivot axis R is first moved to a predetermined position corresponding to the cup 2A in the X direction while the pivot of the arm 54 is stopped. In FIG. 21, an arm 54 in a state where the pivot axis R is positioned at a predetermined position is illustrated by a two-dot chain line. Thereafter, the arm 54 is pivoted to the direction indicated by the solid line in FIG. 21 while the X direction movement of the pivot axis R is stopped. Then, the resist ejection nozzle 41B is conveyed to the standby position 20A. Similarly, when the resist ejection nozzle 41B is conveyed to the standby position 20B, the resist ejection nozzle 41B may be conveyed to the standby position 20B by pivoting the arm 54 after the pivot axis R is moved to a predetermined position in the X direction corresponding to the cup 2B. The present disclosure is not limited to the case where the nozzles 41 are conveyed to the standby positions 20A and 20B. For example, when the nozzles 41 are retracted from the processing position to the outside of the cups 2, the pivot of the arm 54 and the X direction movement of the arm 54 may also be performed at different timings.

Further, in the exemplary processing, it is not necessary to perform pre-wetting by a thinner. In that case, the resist ejection nozzles 41 positioned at the standby positions 20A and 20B are conveyed directly onto the central portion of the wafer W of the cup 2A or the central portion of the wafer W of the cup 2B. Further, in the exemplary processing, the nozzle 41B retracted from the processing position is moved onto the placement region of the nozzle placing portion 3 and is conveyed from the placing region to the standby position 20A or 20B, but the nozzle is not limited to being moved so as to pass over the placement region as such. However, in order to suppress the load on the pipes 45, the nozzles are conveyed from the rear side of the standby regions 20A and 20B to the standby regions 20A and 20B.

Figure 12:
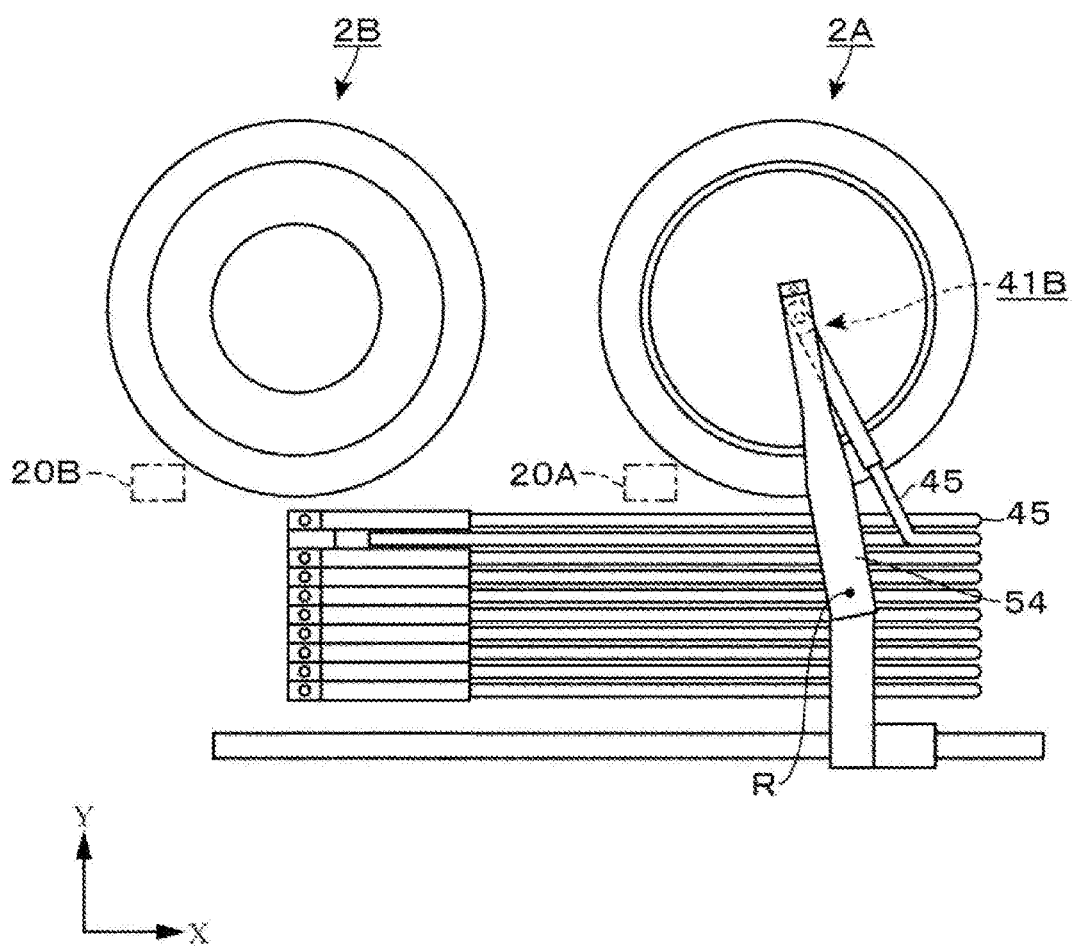
FIG. 12 is a schematic plan view of the resist coating apparatus.

Meanwhile, in the exemplary processing, the direction of the arm 54 is always the same when ejecting the resist onto the wafer W in the cup 2A or ejecting the resist to the wafer W in the cup 2B (see, e.g., FIGS. 12 and 16). However, the present disclosure is not limited to controlling the direction of the arm 54 in that manner. For example, a resist ejection nozzle 41 may be disposed at the processing position of the cup 2A by making the tip of the arm 54 directed to the right with respect to the pivot axis R as illustrated in FIG. 22, instead of making the tip of the arm 54 directed to the left with respect to the pivot axis R as illustrated in FIG. 12.

Figure 22:
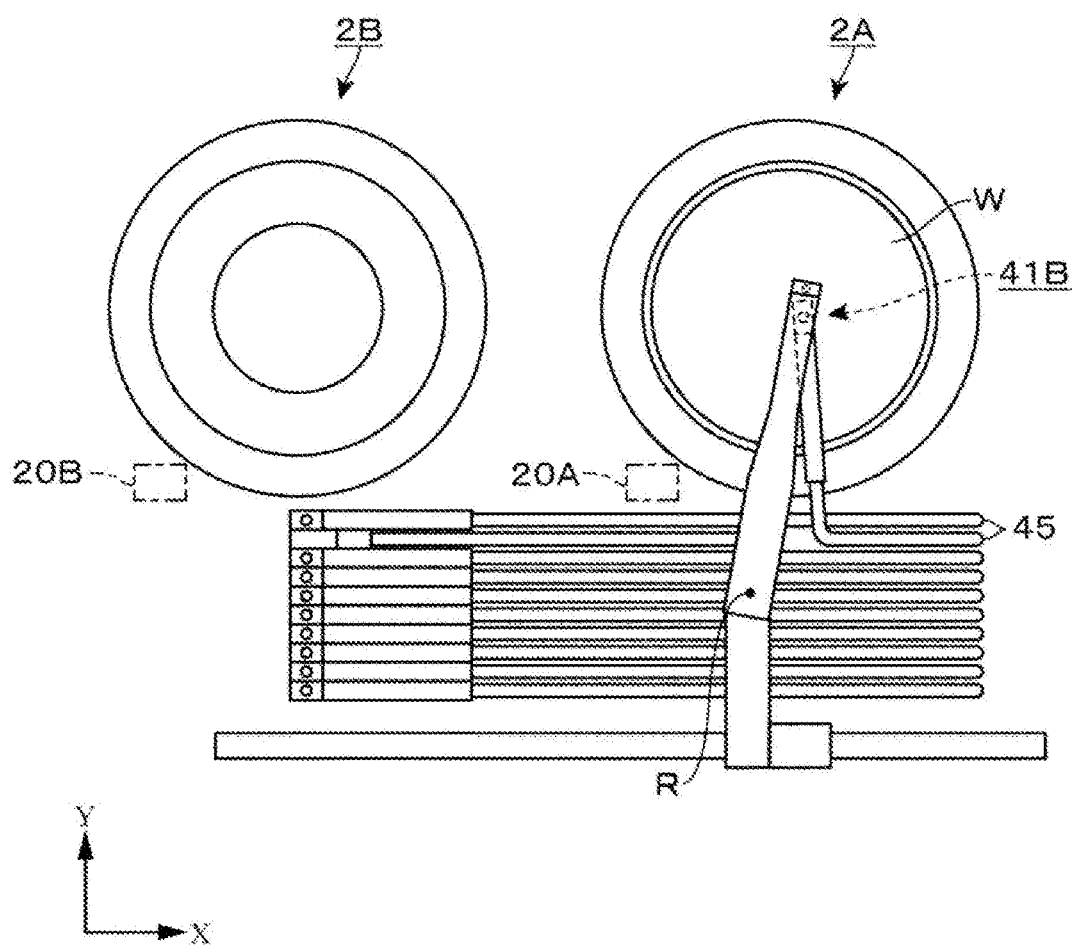
FIG. 22 is a plan view of the resist coating apparatus.

However, as apparent from FIGS. 12 and 22, in the conveyance example of the nozzle 41B in FIG. 12, the bending of the pipe 45 connected to the resist ejection nozzle 41B is suppressed from being increased, as compared to the conveyance example of the nozzle 41B in FIG. 22. When the size of the bending is suppressed in that manner, it is possible to suppress the swelling of the pipe 45 due to the bending. As a result, it is possible to more reliably suppress the pipe 45 from interfering with and rubbing against the other pipes 45. Further, in the conveyance example illustrated in FIG. 22, it is necessary to increase the pivot amount of the arm 54 in order to convey the resist ejection nozzle 41 from the nozzle placing portion 3 onto the wafer W in the cup 2A, as compared to the conveyance example illustrated in FIG. 12. Therefore, the conveyance example illustrated in FIG. 12 may increase the throughput of the resist coating apparatus 1.

Further, when a parameter for controlling the pivot of the arm 54 is set by making the directions of the arms 54 at the time of ejecting the resist with respect to the cups 2A and 2B as in the conveyance example of FIG. 12, the parameter may be applied as a parameter for the other cup 2. Thus, the adjustment time of the apparatus may be shortened. In the left-and-right direction, two cups 2A and 2B are provided. However, the present disclosure is not limited thereto, and three or more cups may be provided. In that case, the direction of the arm 54 when the resist ejection nozzle 41 is disposed at the processing position of each cup makes the same. Therefore, for the reason described above, it is possible to prevent an increase in the time required for adjustment even though the number of cups is relatively large. In the case where three or more cups are provided as described above, the cups are not limited to being arranged on a straight line in a plan view, and may be arranged on a curved plane, for example, a circular arc.

Further, in each of the exemplary processings described above, in both the case of processing the wafer W in the cup 2A and the case of processing the wafer W in the cup 2B, the arm 54 is pivoted in the clockwise direction in a plan view, so that the resist ejection nozzles 41 are conveyed onto respective wafers W. Therefore, it is possible to suppress the position of the resist ejection nozzle 41 on the wafer W at the time of processing the wafer W in the cup 2A and the position of the resist ejection nozzle 41 on the wafer W at the time of processing the wafer W of the cup 2B from being displaced due to backlash of the arm 54.

Further, rear side standby positions may be set to cause the resist ejection nozzle 41 held by the arm 54 to stand by before being conveyed to the standby positions 20A and 20B. The rear side standby positions are set on the rear sides of the standby positions 20A and 20B to reduce the standby time of the resist ejection nozzle 41 by the arm 54 at the standby positions 20A and 20B, and more reliably suppress the load on the pipe 45 connected to the resist ejection nozzle 41 held by the arm 54.

For example, for each of the resist ejection nozzles 41, the rear side standby positions are set to separately correspond to the standby position 20A and the standby position 20B. A position displaced to the right side (cup 2A side) along the left-and-right direction above the placement region of each of the resist ejection nozzles 41A to 41J is the rear side standby position corresponding to the standby position 20A, and a position displaced to the left side (the cup 2B side) is the rear side standby position corresponding to the standby position 20A. That is, the rear side standby positions are set for each resist ejection nozzle 41 such that twisting of the pipe 45 connected to the held resist ejection nozzle 41 and bending thereof in a plan view do not occur. Then, when the time reaches a predetermined time before the time when the resist is ejected to the wafer W, the resist ejection nozzle 41 on standby at the rear side standby position is conveyed from the rear side standby position to a standby position corresponding to the rear side standby position among the standby positions 20A and 20B.

Figure 23:
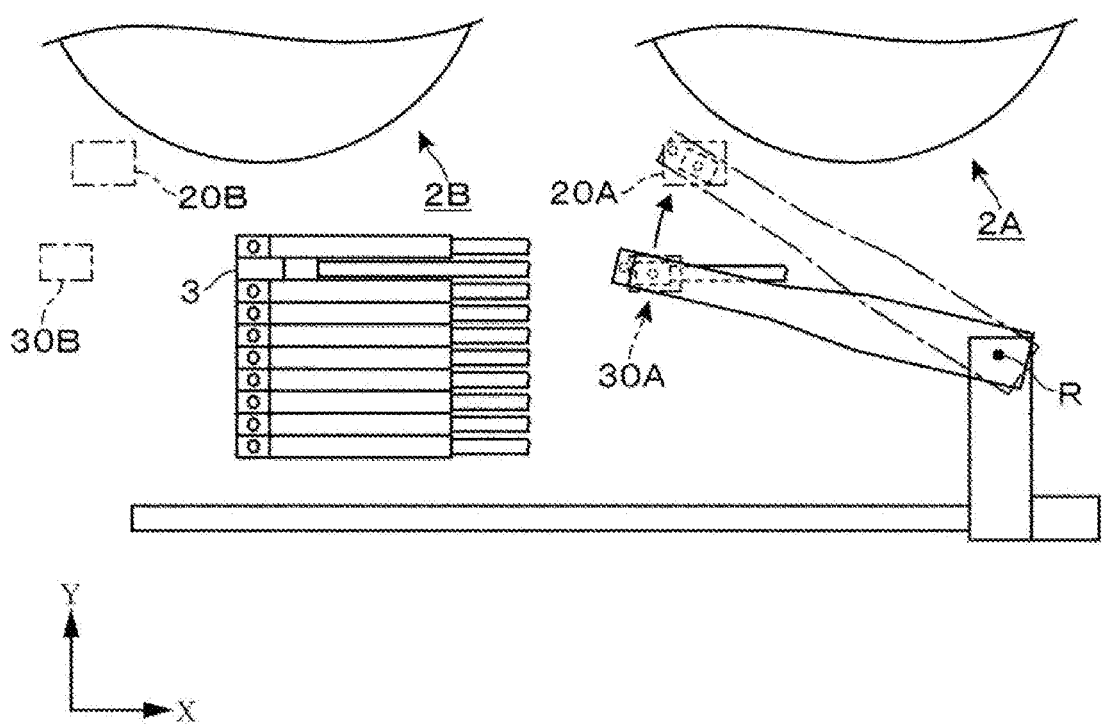
FIG. 23 is a plan view of the resist coating apparatus.
Figure 24:
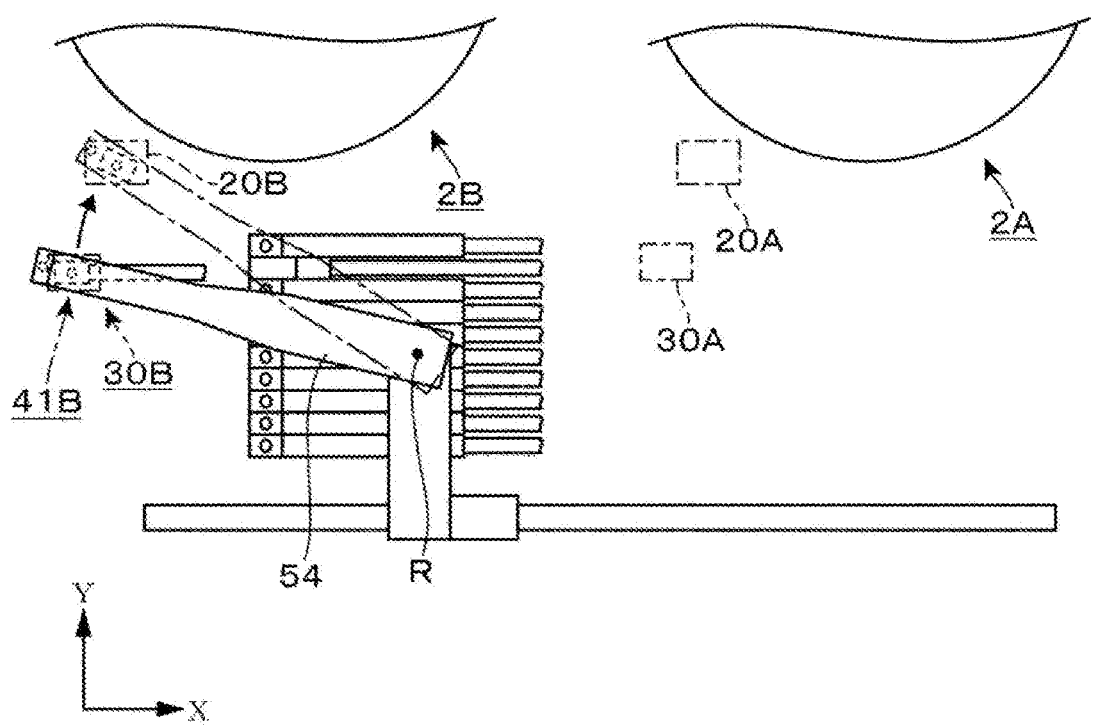
FIG. 24 is a plan view of the resist coating apparatus.

In FIGS. 23 and 24, the rear side standby positions set corresponding to the standby positions 20A and 20B with respect to the resist ejection nozzle 41B are denoted by reference numerals 30A and 30B, respectively. Concerning the conveyance of the resist ejection nozzle 41B in the case where the rear side standby positions 30A and 30B are set as described above, descriptions will be made on the difference from the conveyance described with reference to FIGS. 8 to 17 in the case where the rear side standby positions 30A and 30B are not set. After the resist ejection nozzle 41B is held by the arm 54, the resist ejection nozzle 41B is conveyed to the rear standby position 30A in cooperation with the X direction movement and the pivot of the arm 54, and stands by. In FIG. 23, the arm 54 that holds the nozzle 41B on standby at the rear side standby position 30A is indicated by a solid line. Then, the arm 54 is pivoted, and the resist ejection nozzle 41B is conveyed to the standby position 20A and stands by. In FIG. 23, the arm 54 that holds the nozzle 41B on standby at the standby position 20A is indicated by a two-dot chain line. Thereafter, as described with reference to FIG. 11, the resist ejection nozzle 41B is conveyed onto the wafer W accommodated in the cup 2A.

After the resist is ejected onto the wafer W in the cup 2A, the resist ejection nozzle 41B is conveyed to the rear side standby position 30B and stands by. In FIG. 24, the arm 54 that holds the nozzle 41B on standby at the rear side standby position 30B is indicated by a solid line. Then, the arm 54 is pivoted, and the resist ejection nozzle 41B is conveyed to the standby position 20B and stands by. In FIG. 24, the arm 54 that holds the nozzle 41B on standby at the standby position 20B is indicated by a two-dot chain line. Thereafter, as described with reference to FIG. 15, the resist ejection nozzle 41B is conveyed onto the wafer W accommodated in the cup 2A and ejects the resist to the wafer W.

In the case where the rear side standby positions 30A and 30B are set as described above, the conveyance is controlled, for example, such that the time for the resist ejection nozzle 41B to stand by at the standby position 20A is shorter than the time to stand by at the rear side standby position 30A, and the time to stand by at the standby position 20B is shorter than the time to stand by at the rear side standby position 30B. When the conveyance is controlled as described above, occurrence of deformation in the pipe 45 may be more reliably suppressed.

In the examples illustrated in FIGS. 23 and 24, the rear side standby position corresponding to the standby position 20A and the rear side standby position placed at the standby position 20B are set at different positions, but may be set in a common position. For example, as described with reference to FIGS. 8 to 17, when the nozzle 41 is conveyed so as to move on the placement region of the nozzle placing portion 3, the position above the placement region may be set as a common rear side standby position corresponding to both the standby position 20A and the standby position 20B, and the nozzle 41 may stand by at the position. However, as illustrated in FIGS. 23 and 24, when the rear side standby position corresponding to the cup 2A and the rear side standby position corresponding to the cup 2B are set at different positions and near the standby positions 20A and 20B, it is possible to promptly convey the nozzles 41 from the respective rear side standby positions to the standby positions 20A. Thus, a decrease in the throughput of the apparatus may be suppressed.

Each rear side standby position may be able to suppress the bending in a plan view and twisting of the pipes 45 connected to the resist ejection nozzles 41 as compared with the case where the resist ejection nozzles 41 stands by at the standby positions 20A and 20B. Therefore, in the above-described examples, the rear side standby position is the same as the position of the placement region of the nozzle 41 when viewed in the Y direction, but may be a position slightly displaced from the placement region in the Y direction.

Each of the above-described examples may be appropriately changed or combined. In addition, the processing liquid is not limited to a resist, and may be, for example, a chemical liquid for forming an insulating film, a chemical liquid for forming an antireflective film, a cleaning liquid for cleaning the surface of the wafer W, a developer, or an adhesive for bonding the wafer W.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a plurality of substrate holders arranged in a left-and-right direction and defining a plurality of substrate placement regions when viewed from above;
a nozzle that supplies a processing liquid via a pipe to a substrate at a processing position within each of the substrate placement regions to process the substrate;
a stationary nozzle placing portion which is provided behind the substrate holders and on which the nozzle is placed, the nozzle placing portion and pipe defining a nozzle placement region when viewed from above;
an arm that detachably holds the nozzle;
a driver that horizontally pivots the arm around a pivot axis positioned behind the stationary nozzle placing portion and moves the pivot axis in the left-and-right direction; and
a controller that outputs a control signal to convey the nozzle held by the arm from the nozzle placement region to a standby position, cause the nozzle to stand by at the standby position, and then, directly convey the nozzle to the processing position,
wherein the standby position is outside the substrate placement regions and the nozzle placement region, the standby position is located between the processing position and the nozzle placement region when viewed from above.

2. The liquid processing apparatus of claim 1, wherein the nozzle is connected with a pipe that supplies the processing liquid to the nozzle, and
the pipe is provided to extend along the left-and-right direction from the nozzle positioned in the nozzle placement region such that deformation of the pipe is suppressed when the nozzle is positioned in the nozzle placement region rather than the processing position.

3. The liquid processing apparatus of claim 1, wherein a plurality of nozzles are provided and selectively held by the arm.

4. The liquid processing apparatus of claim 1, wherein the controller outputs a control signal to cause the nozzle held by the arm to stand by at a rear side standby position set behind the standby position before the nozzle is conveyed to the standby position.

5. The liquid processing apparatus of claim 4, wherein a time during which the nozzle is positioned at the rear side standby position is longer than a time during which the nozzle is positioned at the standby position.

6. The liquid processing apparatus of claim 1, wherein, when the nozzle is conveyed to the processing position within each of the substrate placement regions, the arm is pivoted in the same direction to convey the nozzle.

7. A liquid processing method comprising:
conveying a nozzle connected to a pipe from a nozzle placement region defined by a stationary nozzle placing portion and the pipe when viewed from above, to a standby position;
causing the nozzle to stand by at the standby position; and
conveying the nozzle directly to a processing position within a plurality of substrate placement regions after standing by at the standby position,
wherein the nozzle placement region is located behind the substrate placement regions, and
wherein the standby position is outside the substrate placement regions and the nozzle placement region, the standby position is located between the processing position and the nozzle placement region when viewed from above.

8. A non-transitory computer-readable storage medium that stores a computer program for use in a substrate processing apparatus for performing a liquid processing on a substrate,
wherein the computer program, when executed, causes a computer to execute a liquid processing method comprising:
conveying a nozzle connected to a pipe from a nozzle placement region defined by a stationary nozzle placing portion and the pipe when viewed from above, to a standby position;
causing the nozzle to stand by at the standby position; and
conveying the nozzle directly to a processing position within a plurality of substrate placement regions after standing by at the standby position,
wherein the nozzle placement region is located behind the substrate placement regions, and
wherein the standby position is outside the substrate placement regions and the nozzle placement region, the standby position being located between the processing position and the nozzle placement region when viewed from above.

9. The liquid processing method of claim 7, further comprising:
   causing the nozzle to stand by at a rear side standby position set behind the standby position before the nozzle is conveyed to the standby position.

10. The liquid processing method of claim 9, wherein a time during which the nozzle is positioned at the rear side standby position is longer than a time during which the nozzle is positioned at the standby position.

* * * * *